US010141206B2

(12) United States Patent
Morioka

(10) Patent No.: US 10,141,206 B2
(45) Date of Patent: Nov. 27, 2018

(54) SUBSTRATE PROCESSING APPARATUS AND GAP WASHING METHOD

(71) Applicant: SCREEN Holdings Co., Ltd., Kyoto (JP)

(72) Inventor: Toshihito Morioka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/423,821

(22) Filed: Feb. 3, 2017

(65) Prior Publication Data

US 2017/0236728 A1     Aug. 17, 2017

(30) Foreign Application Priority Data

Feb. 17, 2016 (JP) .................................. 2016-28311
Jan. 25, 2017 (JP) .................................. 2017-11643

(51) Int. Cl.
*H01L 21/67* (2006.01)
*B08B 3/02* (2006.01)
*B05B 12/14* (2006.01)

(52) U.S. Cl.
CPC ........ *H01L 21/67051* (2013.01); *B05B 12/14* (2013.01); *B08B 3/02* (2013.01)

(58) Field of Classification Search
None
See application file for complete search history.

(56) References Cited

U.S. PATENT DOCUMENTS

| 7,584,760 B2 * | 9/2009 | Miya ...................... B08B 17/00 |
| | | 134/137 |
| 7,913,706 B2 | 3/2011 | DeKraker et al. ............ 134/198 |
| 2007/0227444 A1 | 10/2007 | Nishide ........................... 118/52 |
| 2008/0078426 A1 | 4/2008 | Miya et al. ..................... 134/30 |
| 2014/0261571 A1 | 9/2014 | Goto et al. ....................... 134/33 |

FOREIGN PATENT DOCUMENTS

| JP | 2002-319561 A | 10/2002 |
| JP | 2010-056218 A | 3/2010 |
| JP | 2015-162557 A | 9/2015 |
| JP | 2015-207661 A | 11/2015 |
| KR | 10-2007-0097 A | 10/2007 |
| KR | 10-2008-0029 A | 4/2008 |
| KR | 10-2014-0113 A | 9/2014 |

* cited by examiner

*Primary Examiner* — Rita P Adhlakha
(74) *Attorney, Agent, or Firm* — Ostrolenk Faber LLP

(57) ABSTRACT

A substrate processing apparatus includes a washing liquid supply unit which supplies a washing liquid to a washing liquid discharge port which is open in the outer circumferential surface of a body, a rotation unit which relatively rotates the opposing member and the body around a rotational axis passing through the central portion of the upper surface of the substrate and a washing control unit which controls the washing liquid supply unit and the rotation unit so as to wash the cylindrical gap, where the washing control unit performs a rotation step of controlling the rotation unit so as to relatively rotate the opposing member and the body and a washing liquid discharging step of controlling the washing liquid supply unit so as to discharge a washing liquid from the washing liquid discharge port simultaneously with the rotation step.

6 Claims, 12 Drawing Sheets

SUBSTRATE PROCESSING APPARATUS AND GAP WASHING METHOD

BACKGROUND OF THE INVENTION

1. Field of the Invention

The present invention relates to a substrate processing method in which a processing fluid is used to process an upper surface of a substrate and a gap washing method in which a gap between a body opposite the upper surface of the substrate and an opposing member is washed. Examples of substrates to be processed include semiconductor wafers, substrates for liquid crystal display devices, substrates for plasma displays, substrates for FEDs (field emission displays), substrates for optical disks, substrates for magnetic disks, substrates for magneto-optical disks, substrates for photomasks, ceramic substrates, substrates for solar cells.

2. Description of Related Art

In the manufacturing process of a semiconductor device or a liquid crystal display device, a substrate processing apparatus is used that processes a substrate such as a semiconductor wafer or a glass substrate for liquid crystal display devices. A single substrate processing-type substrate processing apparatus that processes substrates one by one includes, for example, a spin chuck which holds a substrate horizontally and rotates the substrate and a processing liquid supply unit which supplies a processing liquid to the substrate held by the spin chuck, a shielding member which opposes the substrate held by the spin chuck from above and a center axis nozzle which is stored in a central opening formed in a central portion of the shielding member. The shielding member is a member which approximates an upper surface of the substrate to shield the upper surface from a space therearound.

When the substrate is processed with this substrate processing apparatus, for example, in a state where the shielding member and the center axis nozzle are retracted to a retraction position which is largely separated above the substrate, the processing liquid from the processing liquid supply unit is supplied to the upper surface of the substrate. As the processing liquid is supplied to the upper surface of the substrate, a processing liquid mist is produced above the substrate, and the processing liquid mist enters cylindrical gaps, with the result that the processing liquid mist may be adhered to an inner circumferential surface of the shielding member and an outer circumferential surface of the center axis nozzle. Hence, it is necessary to wash the cylindrical gaps.

Japanese Patent Application Publication No. 2010-56218 discloses a method of supplying to a lower surface of a shielding member a washing liquid from a washing liquid nozzle to wash the lower surface of the shielding member.

SUMMARY OF THE INVENTION

It can be considered to spray the washing liquid from the washing liquid nozzle disclosed in Japanese Patent Application Publication No. 2010-56218 to cylindrical gaps from below to thereby wash the cylindrical gaps. However, the intervals between the cylindrical gaps are generally narrow, and thus it is difficult to satisfactorily spread, across the cylindrical gaps, the washing liquid sprayed from below. Hence, it is impossible to satisfactorily wash the cylindrical gaps.

Hence, it is desired to satisfactorily wash the cylindrical gaps which are demarcated between the outer circumferential surface of a body (center axis nozzle) and the inner circumferential surface of an opposing member (shielding member).

Hence, an object of the present invention is to provide a substrate processing apparatus and a gap washing method which can satisfactorily wash the cylindrical gaps which are demarcated between the outer circumferential surface of the body and the inner circumferential surface of the opposing member.

The present invention provides a substrate processing apparatus including, a substrate holding unit which holds a substrate in a horizontal posture, a body which includes an outer circumferential surface and an opposing portion opposite a central portion of an upper surface of the substrate, which is extended in an up/down direction, and whose outline is cylindrical, an opposing member which surrounds an outer circumference of the body, which includes an inner circumferential surface that forms a cylindrical gap with the outer circumferential surface of the body and which opposes the upper surface of the substrate, a washing liquid discharge port which is open in the outer circumferential surface of the body and which discharges a washing liquid toward the inner circumferential surface, a washing liquid supply unit which supplies the washing liquid to the washing liquid discharge port, a rotation unit which relatively rotates the opposing member and the body around a rotational axis passing through the central portion of the upper surface of the substrate and a washing control unit which controls the washing liquid supply unit and the rotation unit so as to wash the cylindrical gap, where the washing control unit performs a rotation step of controlling the rotation unit so as to relatively rotate the opposing member and the body and a washing liquid discharging step of controlling the washing liquid supply unit so as to discharge the washing liquid from the washing liquid discharge port simultaneously with the rotation step.

In this configuration, while the opposing member and the body are being relatively rotated, the washing liquid is discharged from the washing liquid discharge port formed in the outer circumferential surface of the body toward the inner circumferential surface of the opposing member. Since the inner circumferential surface of the opposing member is being rotated with respect to the outer circumferential surface of the body, the washing liquid discharged from the washing liquid discharge port is pulled by the rotation of the inner circumferential surface and is directed downward while being rotated. In other words, a swirling flow which is directed downward is produced in the cylindrical gap. Hence, a centrifugal force and a gravitational force act on the washing liquid flowing through the cylindrical gap, and with these physical forces, it is possible to remove the contaminants adhered to the inner circumferential surface and/or the outer circumferential surface. In this way, it is possible to satisfactorily wash the cylindrical gap.

In the preferred embodiment in the invention, the washing liquid supply unit includes a washing liquid line through which a washing liquid is passed and which is inserted through the interior of the body, and a downstream end of the washing liquid line is open in the outer circumferential surface of the body so as to form the washing liquid discharge port.

In this configuration, the washing liquid supply unit includes the washing liquid line which is inserted through the interior of the body. In other words, it is possible to supply the washing liquid through the interior of the body to the washing liquid discharge port formed in the outer circumferential surface of the body. In this way, it is possible to easily realize the configuration in which a washing liquid is discharged from the washing liquid discharge port formed in the outer circumferential surface of the body toward the inner circumferential surface of the opposing member.

The washing liquid line may include an up/down direction line which is extended straight in an up/down direction and a connection line which connects a lower end of the up/down direction line and the washing liquid discharge port.

In this configuration, the washing liquid line includes the up/down direction line and the connection line which connects the washing liquid discharge port formed in the outer circumferential surface of the body and the lower end of the up/down direction line. In this way, it is possible to easily realize the configuration in which while the washing liquid line is inserted through the interior of the body, the washing liquid is discharged from the washing liquid discharge port formed in the outer circumferential surface of the body toward the inner circumferential surface of the opposing member.

The washing liquid discharge port may include an oblique discharge port which discharges a washing liquid obliquely downward. In this configuration, since the washing liquid is discharged obliquely downward from the washing liquid discharge port, a rise of the washing liquid supplied to the cylindrical gap can be reduced. In this way, it is possible to satisfactorily form, the swirling flow which is directed downward.

The apparatus may further include a gas supply unit which supplies, to the cylindrical gap, a gas from a position higher than a position in which a washing liquid is discharged from the washing liquid discharge port in the cylindrical gap. In this case, the washing control unit may control the gas supply unit so as to further perform a gas supplying step of supplying a gas to the cylindrical gap simultaneously with the rotation step and the washing liquid discharging step.

In this configuration, since the gas is supplied from a position higher than a supply position where the washing liquid is supplied from the washing liquid discharge port in the cylindrical gap, it is possible to reduce a rise of the washing liquid supplied to the cylindrical gap. In this way, it is possible to more satisfactorily form the swirling flow which is directed downward.

The apparatus may further include a processing fluid line through which a processing fluid to be supplied to an upper surface of a substrate is passed and which is inserted through the interior of the body. In this case, an opening of a downstream end of the processing fluid line may form a processing fluid discharge port.

In this configuration, the body is a body of the nozzle for discharging the processing fluid. Thus, it is possible to satisfactorily wash the cylindrical gap between the outer circumferential surface of the nozzle and the inner circumferential surface of the opposing member.

The substrate processing apparatus may further include a washing liquid spraying unit which sprays a washing liquid from below toward the opposing portion of the body. In this case, the washing control unit may control the washing liquid spraying unit so as to further perform an opposing portion washing step of spraying a washing liquid to the opposing portion to wash the opposing portion simultaneously with the rotation step and the washing liquid discharging step.

In this configuration, the washing of the cylindrical gap and the opposing portion washing step (the washing of the opposing portion of the body) can be performed at the same time. In this way, the washing of the body can be performed in a short time as compared with a case where the washing of the cylindrical gap and the washing of the opposing portion of the body are respectively performed at different timings.

The present invention provides a gap washing method for washing a cylindrical gap which is demarcated between an outer circumferential surface of a body that includes an opposing portion opposite a central portion of an upper surface of a substrate and that is extended up and down and an inner circumferential surface of an opposing member that surrounds an outer circumference of the body and that opposes the upper surface of the substrate, the gap washing method including a step of preparing a washing liquid discharge port which is open in the outer circumferential surface of the body and which discharges a washing liquid toward the cylindrical gap, a rotation step of relatively rotating the opposing member and the body and a washing liquid discharging step of discharging a washing liquid from the washing liquid discharge port simultaneously with the rotation step.

In this method, while the opposing member and the body are being relatively rotated, the washing liquid is discharged from the washing liquid discharge port formed in the outer circumferential surface of the body toward the inner circumferential surface of the opposing member. Since the inner circumferential surface of the opposing member is being rotated with respect to the outer circumferential surface of the body, the washing liquid discharged from the washing liquid discharge port is pulled by the rotation of the inner circumferential surface and is directed downward while being rotated. In other words, a swirling flow which is directed downward is produced in the cylindrical gap. Hence, a centrifugal force and a gravitational force act on the washing liquid flowing through the cylindrical gap, and with these physical forces, it is possible to remove the contaminants adhered to the inner circumferential surface and/or the outer circumferential surface. In this way, it is possible to satisfactorily wash the cylindrical gap.

The method may further include a gas supplying step of supplying, to the cylindrical gap, a gas from a position higher than a position in which a washing liquid is discharged from the washing liquid discharge port in the cylindrical gap.

In this method, since the gas is supplied from a position higher than a supply position where the washing liquid is supplied from the washing liquid discharge port in the cylindrical gap, it is possible to reduce a rise of the washing liquid supplied to the cylindrical gap. In this way, it is possible to more satisfactorily form the swirling flow which is directed downward.

The method may further include an opposing portion washing step of spraying a washing liquid to the opposing portion to wash the opposing portion simultaneously with the rotation step and the washing liquid discharging step.

In this method, the washing of the cylindrical gap and the opposing portion washing step (the washing of the opposing portion of the body) can be performed at the same time. In this way, the washing of the body can be performed in a short time as compared with a case where the washing of the cylindrical gap and the washing of the opposing portion of the body are respectively performed at different timings.

The aforementioned and other objects, features, and effects of the present invention will be clarified by the following description of preferred embodiments with reference to the accompanying drawings.

DETAILED DESCRIPTION OF PREFERRED EMBODIMENTS

Figure 1:
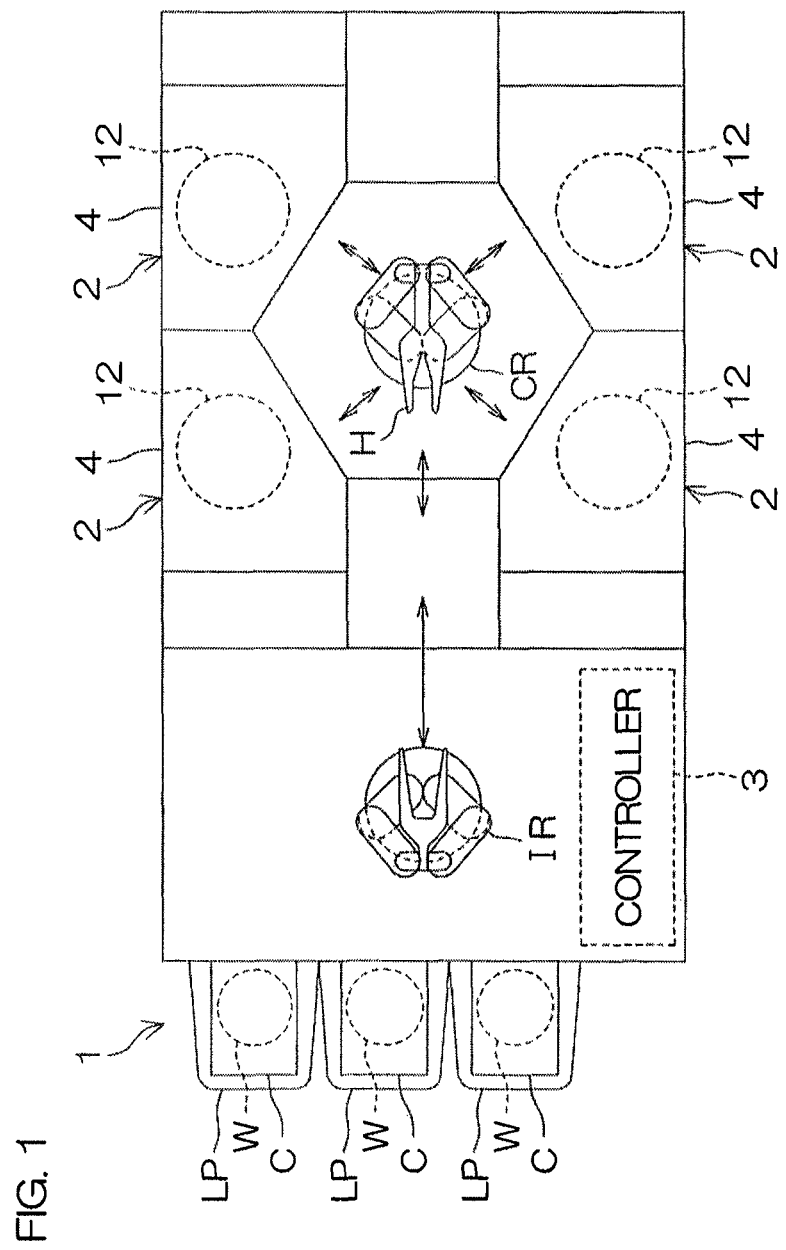
FIG. 1 is a schematic plan view for illustrating the internal layout of a substrate processing apparatus according to a preferred embodiment of the present invention.

FIG. 1 is a schematic plan view for illustrating the internal layout of a substrate processing apparatus 1 which performs a substrate processing method according to a first preferred embodiment of the present invention. The substrate processing apparatus 1 is a single substrate processing-type apparatus which processes substrates W such as silicon wafers one by one. In the preferred embodiment, the substrate W is a disk-shaped substrate. The substrate processing apparatus 1 includes a plurality of processing units 2 which process the substrate W with a processing liquid, a load port LP on which a carrier C for storing a plurality of substrates W to be processed in the processing unit 2 is placed, transfer robots IR and CR each of which transfers the substrate W between the load port LP and the processing unit 2 and a controller (washing control unit) 3 which controls the substrate processing apparatus 1. The transfer robot IR transfers the substrate W between the carrier C and the substrate transfer robot CR. The substrate transfer robot CR transfers the substrate W between the transfer robot IR and the processing unit 2. The plurality of processing units 2 has, for example, the same configuration.

Figure 2:
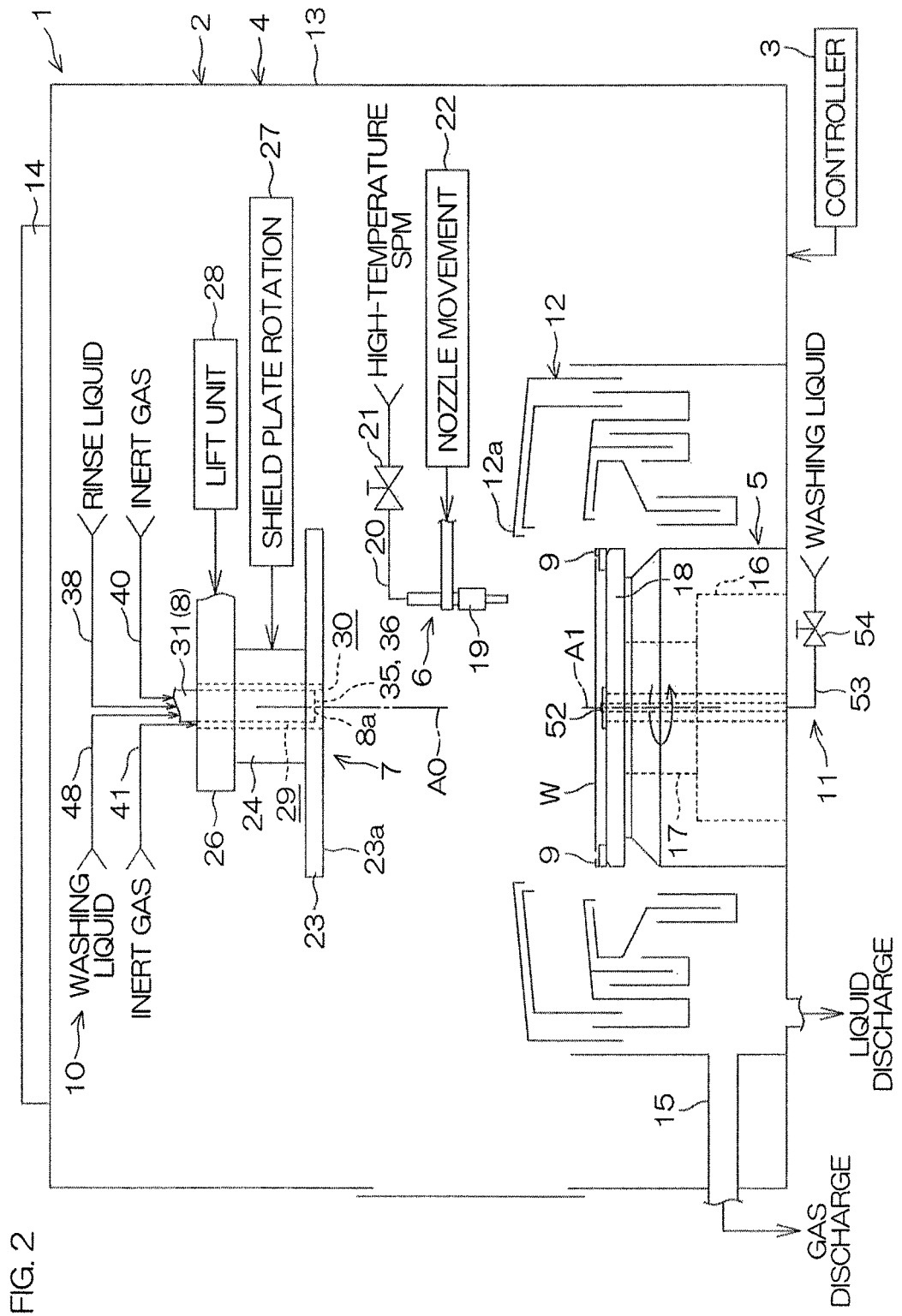
FIG. 2 is a schematic cross-sectional view for illustrating an example of the configuration of a processing unit included in the substrate processing apparatus.

FIG. 2 is a schematic cross-sectional view for illustrating an example of the configuration of the processing unit 2.

The processing unit 2 includes a box-shaped chamber 4, a spin chuck (substrate holding unit) 5 which holds one substrate W in a horizontal posture within the chamber 4 and which rotates the substrate W around a vertical rotational axis A1 passing through the center of the substrate W, a chemical liquid supply unit 6 which supplies a chemical liquid to an upper surface of the substrate W held by the spin chuck 5, an opposing member 7 which opposes the upper surface of the substrate W held by the spin chuck 5, a nozzle 8 which has processing fluid discharge ports (a processing liquid discharge port 35 and a central gas discharge port 36) which oppose a central portion of the upper surface of the substrate W held by the spin chuck 5 and which is inserted up and down through the central portion of the opposing member 7, a washing liquid supply unit 10 which supplies a washing liquid to a washing liquid discharge port (oblique discharge port) 32 formed in the nozzle 8 from the interior of the nozzle 8, a lower surface unit (washing liquid spraying unit) 11 which sprays the washing liquid form below to the processing fluid discharge ports (the processing liquid discharge port 35 and the central gas discharge port 36) of the nozzle 8 in a state where the substrate W is not held by the spin chuck 5 and a cylindrical cup 12 which surrounds the spin chuck 5.

The chamber 4 includes a box-shaped partition wall 13 which stores the spin chuck 5 and the nozzle, a FFU (fan filter unit) 14 serving as a blower unit which blows clean air (air which is filtered by a filter) from an upper portion of the partition wall 13 into the partition wall 13 and an exhaust duct 15 which discharges a gas in the chamber 4 from a lower portion of the partition wall 13. The FFU 14 is arranged over the partition wall 13 and is attached to the ceiling of the partition wall 13. The FFU 14 blows the clean air from the ceiling of the partition wall 13 downward into the chamber 4. The exhaust duct 15 is connected to a bottom portion of the cup 12 and guides the gas in the chamber 4 toward exhaust processing facilities provided in a factory where the substrate processing apparatus 1 is installed. Hence, a downflow (downward flow) which flows downward within the chamber 4 is formed by the FFU 14 and the exhaust duct 15. The substrate W is processed in a state where the downflow is formed within the chamber 4.

As the spin chuck 5, a sandwich-type chuck is adopted which sandwiches the substrate W in a horizontal direction to hold the substrate W horizontally. Specifically, the spin chuck 5 includes a spin motor 16, a rotation shaft 17 which is formed integrally with a drive shaft of the spin motor 16, and a disk-shaped rotation base 18 which is attached to the upper end of the rotation shaft 17 substantially horizontally.

On an upper surface of the rotation base 18, a plurality of (three or more, for example, six) sandwiching members 9 are arranged in a circumferential edge portion thereof. The sandwiching members 9 are arranged, in the circumferential edge portion of the upper surface of the rotation base 18, an appropriate distance apart on a circumference corresponding to the outer circumferential shape of the substrate W.

The spin chuck 5 is not limited to the sandwich type, and for example, a vacuum suction type (vacuum chuck) may be adopted which vacuum-sucks a rear surface of the substrate W to hold the substrate W in a horizontal posture and which further rotates the substrate W in that state around a vertical rotational axis so as to rotate the substrate W held by the spin chuck 5.

The chemical liquid supply unit 6 includes a chemical liquid nozzle 19, a chemical liquid line 20 which is connected to the chemical liquid nozzle 19, a chemical liquid valve 21 which is interposed in the chemical liquid line 20 and a nozzle movement unit 22 which moves the chemical liquid nozzle 19. The chemical liquid nozzle 19 is, for example, a straight nozzle which discharges the solution in the state of a continuous flow. The chemical liquid is supplied to the chemical liquid line 20 from a chemical liquid supply source. In the preferred embodiment, as the chemical liquid, a high-temperature (for example, about 170° C. to 180° C.) sulfuric acid/hydrogen peroxide mixture (SPM) is supplied to the chemical liquid line 20. The SPM whose temperature is raised to the high temperature described above by reaction heat of sulfuric acid and hydrogen peroxide solution is supplied to the chemical liquid line 20.

When the chemical liquid valve 21 is opened, the high-temperature SPM which is supplied from the chemical liquid line 20 to the chemical liquid nozzle 19 is discharged downward from the chemical liquid nozzle 19. When the chemical liquid valve 21 is closed, the discharge of the high-temperature SPM from the chemical liquid nozzle 19 is stopped. The nozzle movement unit 22 moves the chemical liquid nozzle 19 between a processing position where the high-temperature SPM discharged from the chemical liquid nozzle 19 is supplied to the upper surface of the substrate W and a retraction position where the chemical liquid nozzle 19 is retracted to the side of the spin chuck 5 in plan view.

Figure 3:
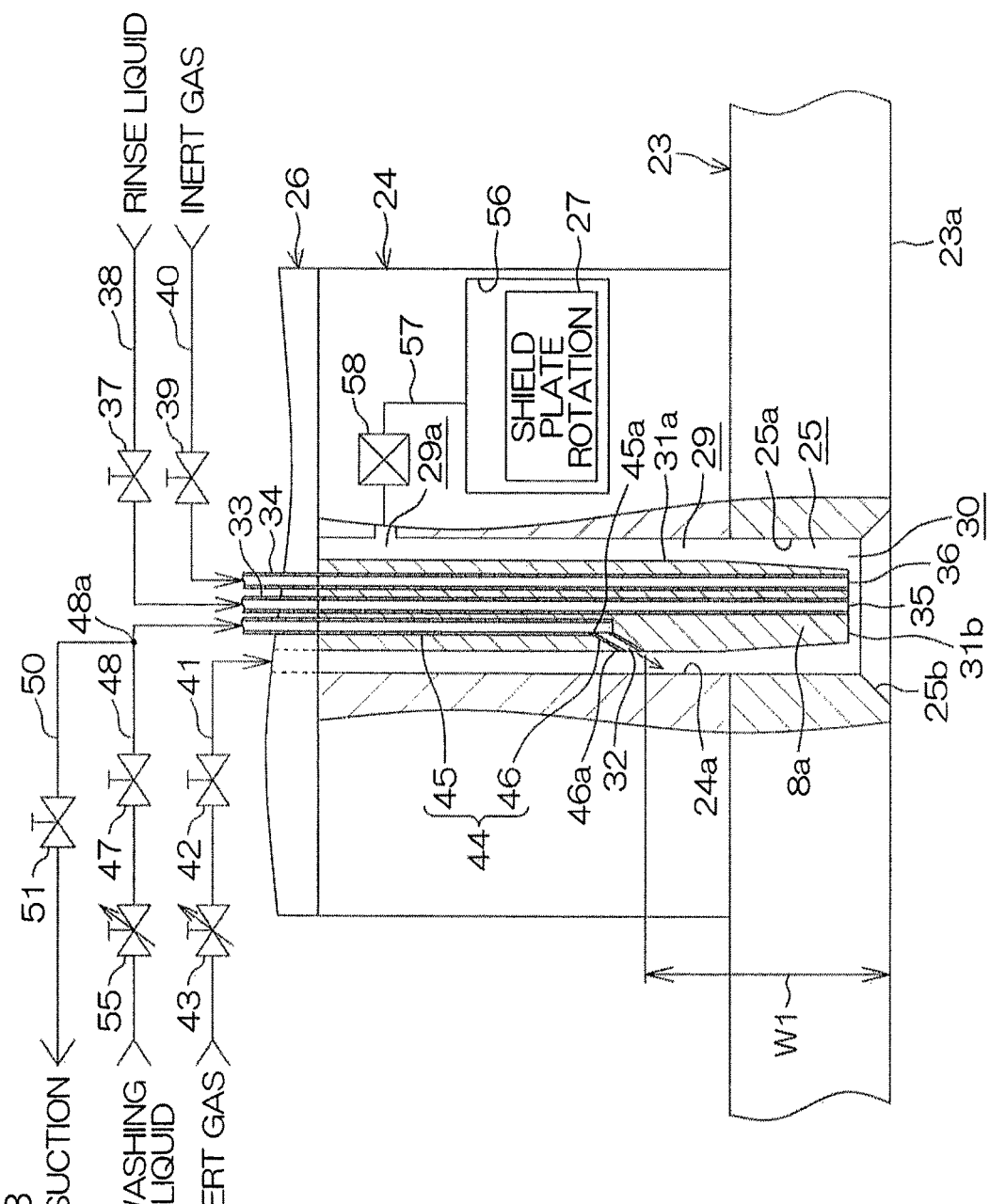
FIG. 3 is a vertical cross-sectional view of an opposing member included in the processing unit.
Figure 4:
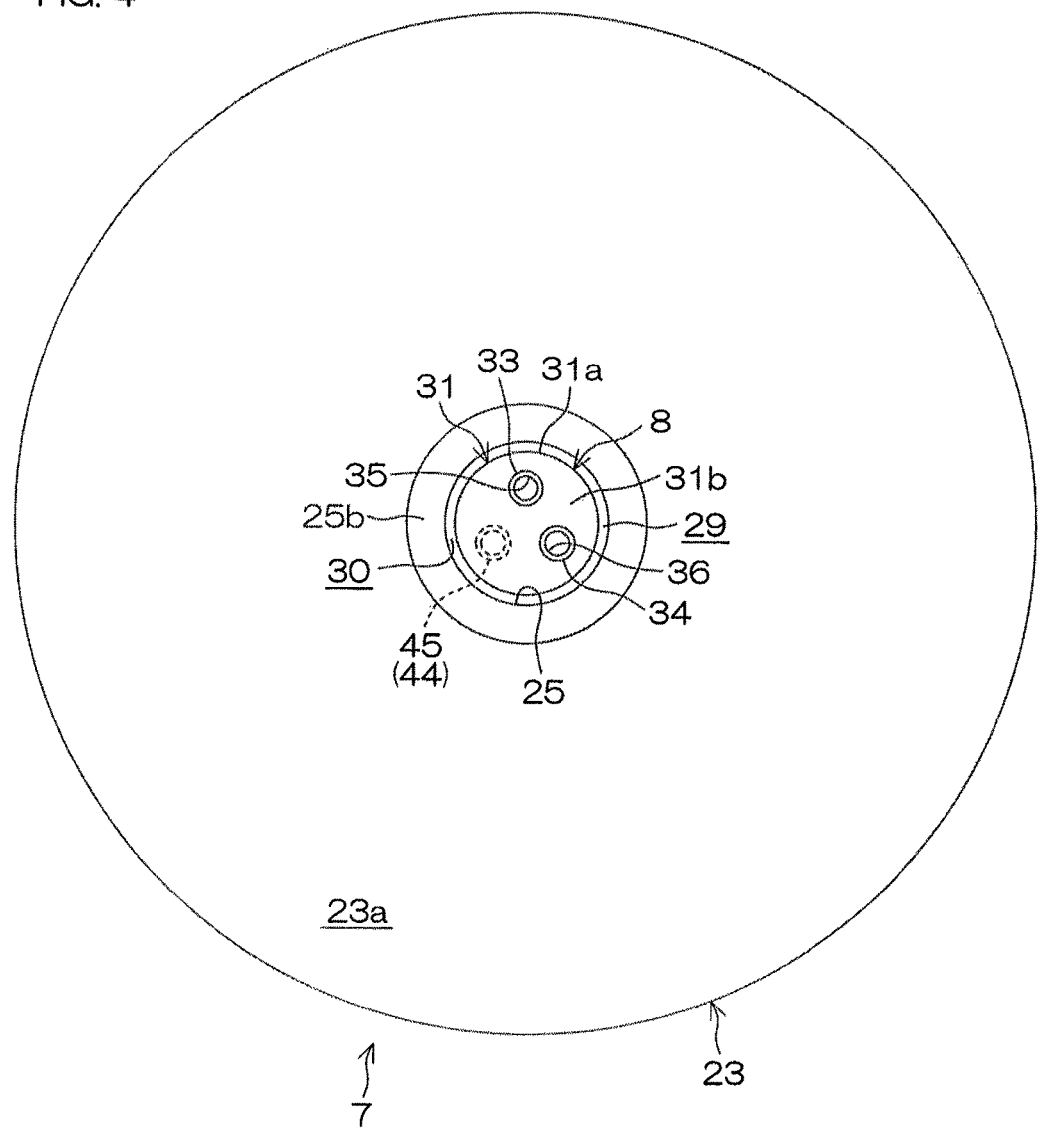
FIG. 4 is a bottom view of the opposing member.

FIG. 3 is a vertical cross-sectional view of the opposing member 7. FIG. 4 is a bottom view of the opposing member 7. The opposing member 7 will be described with reference to FIGS. 2 to 4.

The opposing member 7 includes a shield plate 23 and a rotation shaft 24 which is provided such that the rotation shaft 24 can be rotated integrally with the shield plate 23. The shield plate 23 is formed in the shape of a disk which has a diameter substantially equal to or more than that of the substrate W. The shield plate 23 has, in its lower surface, a circular substrate opposite surface 23a which opposes the entire upper surface of the substrate W. In a central portion of the substrate opposite surface 23a, a circular cylindrical through hole 25 which penetrates up and down the shield plate 23 is formed. The through hole 25 is demarcated by a cylindrical inner circumferential surface 25a. In a lower end portion of the inner circumferential surface 25a, a tapered surface 25b is formed which is opened outward as the inner circumferential surface 25a is extended downward.

The rotation shaft 24 is provided such that the rotation shaft 24 can be rotated around a rotational axis A0 (axis which coincides with the rotational axis A1 of the substrate W) which is vertically extended through the center of the shield plate 23. The rotation shaft 24 is circular cylindrical. An inner circumferential surface 24a of the rotation shaft 24 is formed in the shape of a circular cylindrical surface around the rotational axis A0. The internal space of the rotation shaft 24 communicates with the through hole 25 of the shield plate 23. The inner circumferential surface 24a of the rotation shaft 24 and the inner circumferential surface 25a are flush with each other. The rotation shaft 24 is supported by a support arm 26 which is extended horizontally above the shield plate 23 such that the rotation shaft 24 can be rotated relative to the support arm 26.

A shield plate rotation unit (rotation unit) 27 of a configuration including an electric motor, etc., is coupled to the shield plate 23. The shield plate rotation unit 27 rotates the shield plate 23 and the rotation shaft 24 with respect to the support arm 26 around rotational axis A0. Various types of drive components forming the shield plate rotation unit 27 are stored in a drive component storage space 56 which is provided within the rotation shaft 17 and/or within the support arm 26.

An lift unit 28 of a configuration including an electric motor, a ball screw, etc., is coupled to the support arm 26. The lift unit 28 lifts up and down, in the vertical direction, the opposing member 7 (the shield plate 23 and the rotation shaft 24) and the nozzle 8 together with the support arm 26.

The lift unit 28 lifts up and down the opposing member 7 and the nozzle 8 between an approximation position (see FIG. 11) where the substrate opposite surface 23a of the shield plate 23 approximates the upper surface of the substrate W held by the spin chuck 5 and a retraction position (see FIG. 9) which is provided above the approximation position. The lift unit 28 can hold the shield plate 23 in, for example, four positions (the approximation position, a lower intermediate position (a nozzle washing position, see FIG. 13), an upper intermediate position (a rinsing position, see FIG. 10), and the retraction position. The lower intermediate position is a position which is previously determined between the approximation position and the retraction position. The upper intermediate position is a position which is previously determined between the lower intermediate position and the retraction position.

The nozzle 8 is extended in the up/down direction along the vertical axis passing through the center of the shield plate 23 and the substrate W, that is, the rotational axis A1. In the preferred embodiment, the nozzle 8 functions as a center axis nozzle. The nozzle 8 is arranged above the spin chuck 5. The nozzle 8 is supported by the support arm 26. The nozzle 8 cannot be rotated with respect to the support arm 26. The nozzle 8 is lifted up and down together with the shield plate 23, the rotation shaft 24, and the support arm 26. The nozzle 8 is inserted through the internal space of the rotation shaft 24. A lower surface of the nozzle 8 is arranged substantially at the same height as the substrate opposite surface 23a of the shield plate 23 or higher than the substrate opposite surface 23a. The nozzle 8 is surrounded by a cylindrical gap 29 formed around the nozzle 8 and in the shape of a circular cylinder. The cylindrical gap 29 has a gas dimension of, for example, about 3 mm, and functions as a flow path through which an inert gas is passed. The lower end of the cylindrical gap 29 is open in the shape of a ring which surrounds the nozzle 8, and forms a surrounding gas discharge port 30.

The nozzle 8 includes a columnar body 31 which is extended in the up/down direction. The body 31 includes a circular cylindrical outer circumferential surface 31a and an opposite surface (opposing portion) 31b which is provided in a lower end portion of the body 31 and which opposes the central portion of the upper surface of the substrate W. In the outer circumferential surface 31a of the body 31, at a predetermined circumferential position in a middle portion (a distance W1 (for example, about 50 mm) away from the lower end of the body 31), the washing liquid discharge port 32 is formed. The washing liquid discharge port 32 discharges the washing liquid from the inside toward the outside in plan view. As shown in FIG. 3, the position where the washing liquid discharge port 32 is formed is lower than a connection position 29a of a communication path 57 in the cylindrical gap 29.

A processing liquid line (processing fluid line) 33 and a gas line (processing fluid line) 34 are inserted through the interior of the body 31. The processing liquid line 33 and the center gas line 34 are extended in the up/down direction. An opening which is provided at the downstream end of the processing liquid line 33 forms the processing liquid discharge port (processing fluid discharge port) 35. An opening which is provided at the downstream end of the center gas line 34 forms the central gas discharge port (processing fluid discharge port) 36. The processing liquid discharge port 35 and the central gas discharge port 36 are arranged at the same height as a lower end surface of the body 31. In other words, the lower ends of the processing liquid line 33 and the center gas line 34 are open in the opposite surface 31b of the body 31 and form the processing liquid discharge port 35 and the central gas discharge port 36, respectively.

The processing liquid line 33 is connected to a rinse liquid supply line 38 in which a rinse liquid valve 37 is interposed. When the rinse liquid valve 37 is opened, a rinse liquid (processing fluid) is discharged downward from the processing liquid discharge port 35. The rinse liquid to be supplied to the processing liquid line 33 is, for example, deionized water (DIW), but is not limited to the DIW, and the rinse liquid may be any one of carbonated water, electrolytic ion water, hydrogen water, ozone water, and hydrochloric acid water having a dilute concentration (for example, about 10 ppm to 100 ppm).

The center gas line 34 is connected to a center gas supply line 40 in which a central gas valve 39 is interposed. When the central gas valve 39 is opened, the gas (processing fluid) is discharged downward from the central gas discharge port 36. An example of the gas to be supplied to the center gas line 34 and the gas to be supplied to the cylindrical gap 29 is an inert gas. The inert gas is, for example, either nitrogen gas or clean air.

The cylindrical gap 29 is a gap that is demarcated between the outer circumferential surface 31a of the body 31 and the inner circumferential surfaces 25a and 24a of the opposing member 7 (the shield plate 23 and the rotation shaft 24). The cylindrical gap 29 surrounds the outer circumferential surface 31a of the body 31. The cylindrical gap 29 is connected to a surrounding gas line 41 at a predetermined position higher than the washing liquid discharge port 32. In the surrounding gas line 41, a surrounding gas valve 42 which opens and closes the surrounding gas line 41 and a first flow rate adjustment valve 43 which adjusts the degree of opening of the surrounding gas line 41 to adjust the flow rate of the gas to be supplied to the cylindrical gap 29 are interposed. Although not shown, the first flow rate adjustment valve 43 includes a valve body within which a valve seat is provided, a valve member which opens and closes the valve seat, and an actuator which moves the valve member between an opening position and a closing position. The same is true for other flow rate adjustment valves. In the preferred embodiment, the surrounding gas line 41, the surrounding gas valve 42, and the first flow rate adjustment valve 43 form a gas supply unit.

When the surrounding gas valve 42 is opened, the gas flows to the cylindrical gap 29 at a flow rate corresponding to the degree of opening of the first flow rate adjustment valve 43, and the gas is discharged downward from the surrounding gas discharge port 30. An example of the gas to be supplied to the surrounding gas line 41 and the gas to be supplied to the cylindrical gap 29 is an inert gas. The inert gas is, for example, either nitrogen gas or clean air.

The drive component storage space 56 communicates with the cylindrical gap 29 through the communication path 57. In the communication path 57, a gas seal 58 such as a labyrinth is interposed such that an atmosphere in the drive component storage space 56 is prevented from flowing out into the chamber 4 through the communication path 57 (so as to shield the atmosphere in the drive component storage space 56 from an atmosphere within the chamber 4).

The washing liquid supply unit 10 includes a washing liquid line 44 which is inserted through the interior of the body 31, a washing liquid supply line 48 which is connected to the washing liquid line 44, a washing liquid upper valve 47 which opens and closes the washing liquid supply line 48, and a second flow rate adjustment valve 55 which adjusts the degree of opening of the washing liquid supply line 48 to adjust the flow rate of the washing liquid to be supplied to the washing liquid line 44. The washing liquid line 44 includes an up/down direction line 45 which is extended straight in the up/down direction and a connection line 46 which connects a lower end 45a of the up/down direction line 45 and the washing liquid discharge port 32. The washing liquid line 44 is not open in the lower end surface of the body 31. The connection line 46 is a straight line and is inclined at a predetermined angle (for example, about 30°) with respect to the vertical direction. Hence, the washing liquid discharge port 32 discharges the washing liquid and obliquely downward at an angle of inclination of about 30° with respect to the vertical direction. A downstream end (downstream end of the washing liquid line) 46a of the connection line 46 is not protruded from the outer circumferential surface 31a of the body 31 radially outward. In other words, the washing liquid discharge port 32 is provided flush with the outer circumferential surface 31a. The up/down direction line 45 and the connection line 46 may be separate members or may be formed integrally.

When the washing liquid upper valve 47 is opened, the washing liquid is discharged from the washing liquid discharge port 32 obliquely downward. The washing liquid to be supplied to the washing liquid line 44 is, for example, water. The water is, for example, deionized water (DIW), but is not limited to the DIW, and the washing liquid may be any one of carbonated water, electrolytic ion water, hydrogen water, ozone water, and hydrochloric acid water having a dilute concentration (for example, about 10 ppm to 100 ppm). The same is true for a washing liquid which is supplied to a lower surface nozzle 52.

One end of a suction line 50 which sucks the washing liquid within the washing liquid line 44 is branched and connected to a branch position 48a of the washing liquid supply line 48 between the base end of the washing liquid line 44 and the washing liquid upper valve 47. In the suction line 50, a suction valve 51 which opens and closes the suction line 50 is interposed. The other end of the suction line 50 is connected to a suction device (unillustrated). The suction device is, for example, in a constantly operated state, and when the suction valve 51 is opened, the interior of a part at the downstream side with respect to the branch position 48a in the washing liquid supply line 48 is exhausted, and thus the washing liquid within the part at the downstream side is sucked.

Figure 5:
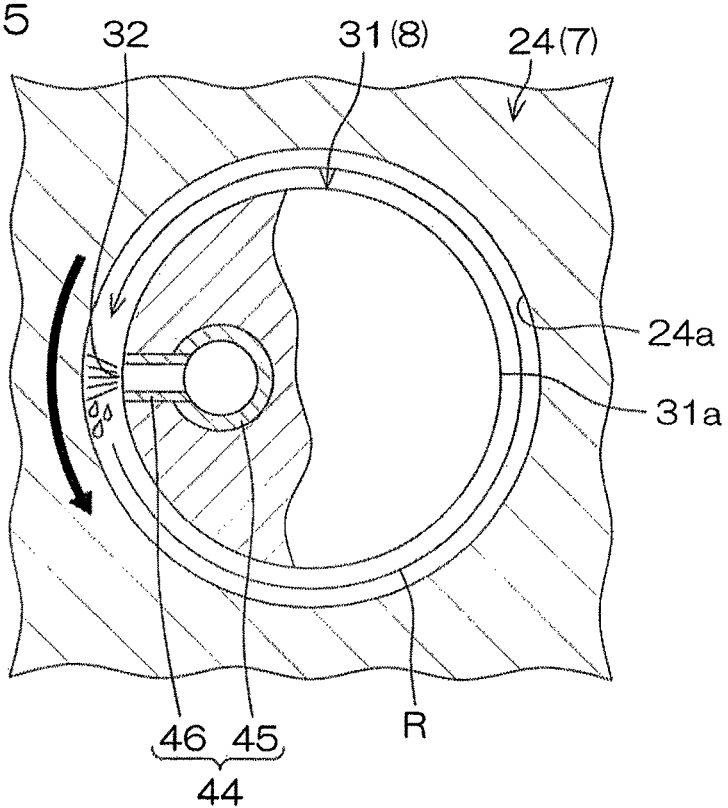
FIG. 5 is a horizontal cross-sectional view for illustrating the flow of a washing liquid discharged from a washing liquid discharge port.
Figure 6:
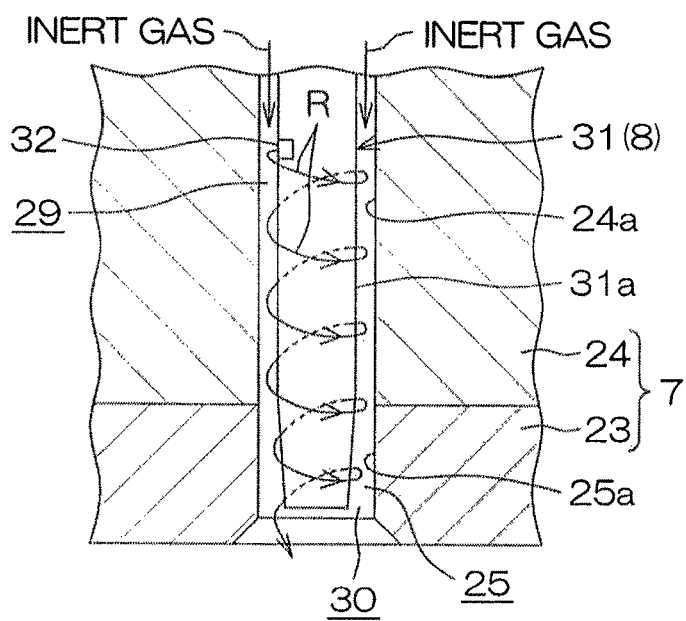
FIG. 6 is a vertical cross-sectional view for illustrating the flow of the washing liquid discharged from the washing liquid discharge port.

FIG. 5 is a horizontal cross-sectional view for illustrating the flow of the washing liquid discharged from the washing liquid discharge port 32. FIG. 6 is a vertical cross-sectional view for illustrating the flow of the washing liquid discharged from the washing liquid discharge port 32. As shown in FIG. 5, the washing liquid discharge port 32 is extended along the radial direction of the body 31 of the nozzle 8 from the inside to the outside.

When the nozzle 8 is washed, the washing liquid upper valve 47 (see FIG. 2) is opened while the shield plate rotation unit 27 (see FIG. 2) is rotating the shield plate 23 and the rotation shaft 24. In this way, as shown in FIGS. 5 and 6, while the opposing member 7 is being rotated with respect to the body 31 of the nozzle 8, the washing liquid is discharged from the washing liquid discharge port 32 formed in the outer circumferential surface 31a of the body 31 toward the inner circumferential surface 24a of the rotation shaft 24. Since the inner circumferential surface 24a is being rotated with respect to the outer circumferential surface 31a, the washing liquid discharged from the washing liquid discharge port 32 is pulled by the rotation of the inner circumferential surface 24a and is directed downward while being rotated. In other words, a swirling flow R which is directed downward is formed in the cylindrical gap 29.

The washing liquid discharge port 32 discharges the washing liquid obliquely downward. Since the washing liquid is discharged obliquely downward from the washing liquid discharge port 32, a rise of the washing liquid supplied to the cylindrical gap 29 can be reduced. In this way, it is possible to satisfactorily form, in the cylindrical gap 29, the swirling flow R which is directed downward.

The lower surface unit 11 includes the lower surface nozzle 52 which discharges the washing liquid upward, a washing liquid lower line 53 which guides the washing liquid to the lower surface nozzle 52 and a washing liquid lower valve 54 which is interposed in the washing liquid lower line 53. When the washing liquid lower valve 54 is opened, the washing liquid is supplied from the washing liquid lower line 53 to the lower surface nozzle 52. In this way, the washing liquid is discharged upward from the lower surface nozzle 52. The washing liquid to be supplied to the lower surface nozzle 52 is, for example, water.

As shown in FIG. 2, the cup 12 is arranged outward (in a direction to move away from the rotational axis A1) with respect to the substrate W held by the spin chuck 5. The cup 12 surrounds the rotation base 18. When in a state where the spin chuck 5 is rotating the substrate W, the processing liquid (the chemical liquid or the rinse liquid) is supplied to the substrate W, the processing liquid supplied to the substrate W is spun off around of the substrate W. When the processing liquid is supplied to the substrate W, an upper end portion 12a of the cup 12 which is open upward is arranged higher than the rotation base 18. Hence, the processing liquid discharged around the substrate W is received by the cup 12. Then, the processing liquid received by the cup 12 is fed to an unillustrated collection device or waste liquid device.

Figure 7:
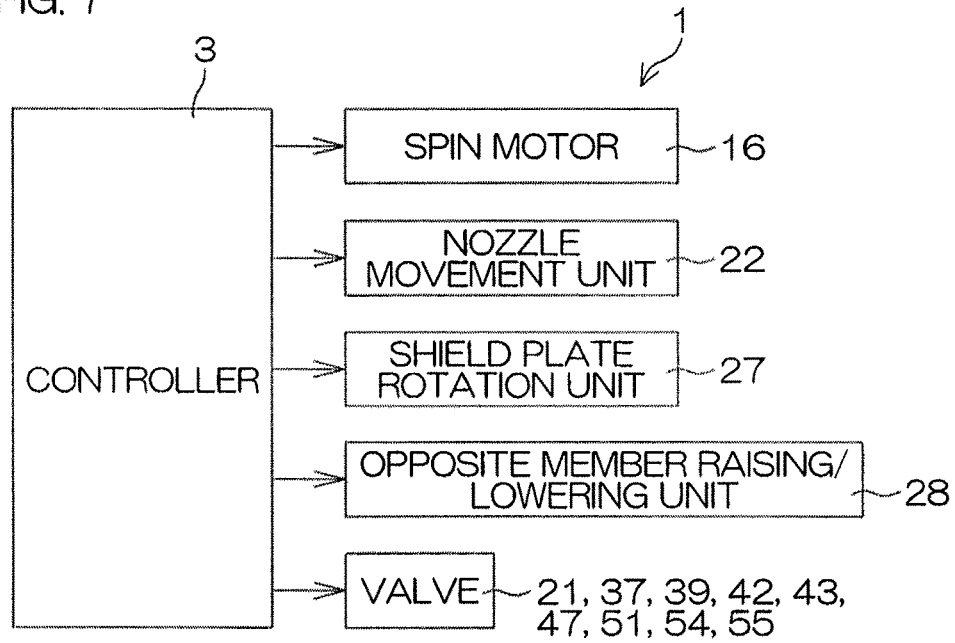
FIG. 7 is a block diagram for illustrating the electrical configuration of the main portion of the substrate processing apparatus.

FIG. 7 is a block diagram for illustrating the electrical configuration of the main portion of the substrate processing apparatus 1.

The controller 3 is formed using, for example, a microcomputer. The controller 3 includes a computation unit such as a CPU, a storage unit such as a fixed memory device and a hard disk drive, and an input/output unit. In the storage unit, programs which are executed by the computation unit are stored.

The controller 3 controls, according to predetermined programs, the operations of the spin motor 16, the nozzle movement unit 22, the shield plate rotation unit 27, the lift unit 28, and the like. The controller 3 further controls, for example, the opening and closing operation of the chemical liquid valve 21, the rinse liquid valve 37, the central gas valve 39, the surrounding gas valve 42, the first flow rate adjustment valve 43, the washing liquid upper valve 47, the suction valve 51, the washing liquid lower valve 54, the second flow rate adjustment valve 55, and the like.

Figure 8:
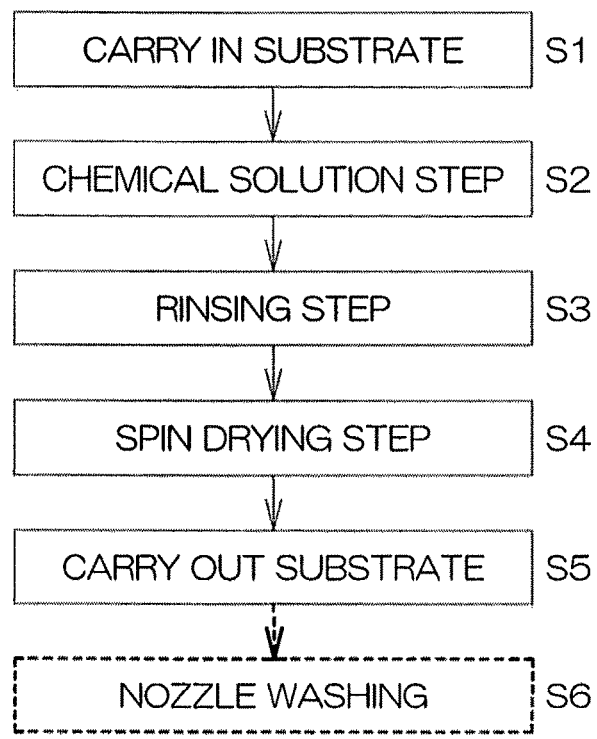
FIG. 8 is a flow diagram for illustrating an example of substrate processing performed by the substrate processing apparatus.
Figure 9:
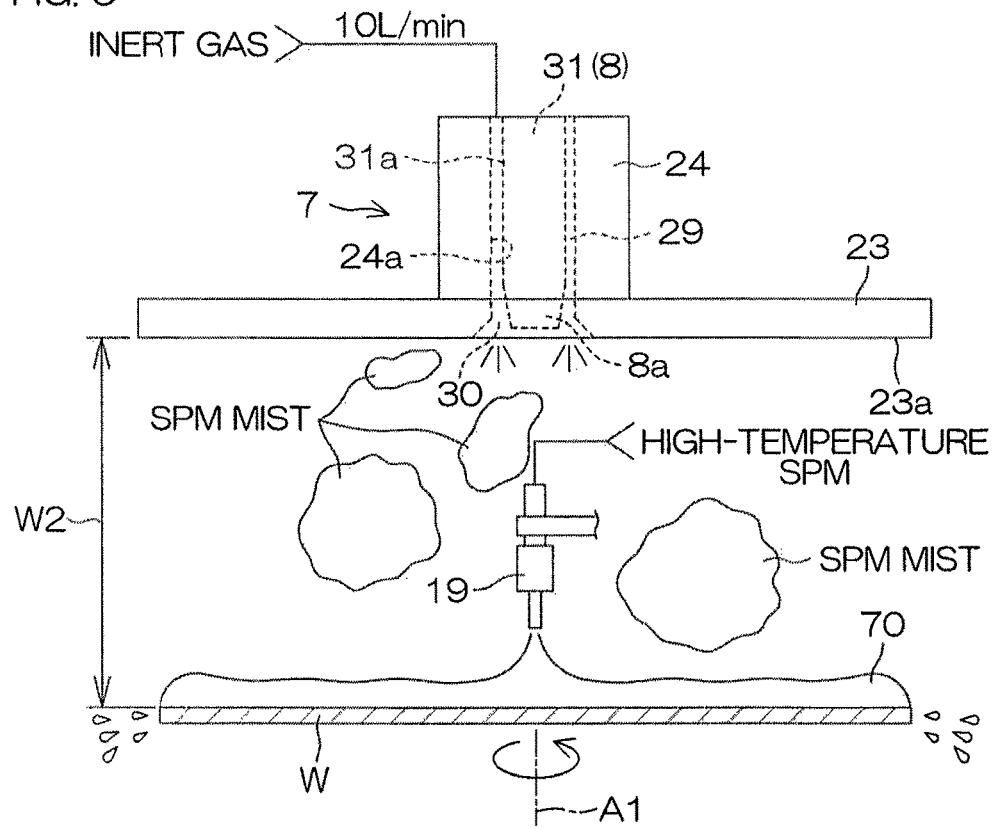
FIG. 9 is a schematic cross-sectional view for illustrating a chemical liquid step shown in FIG. 8.
Figure 10:
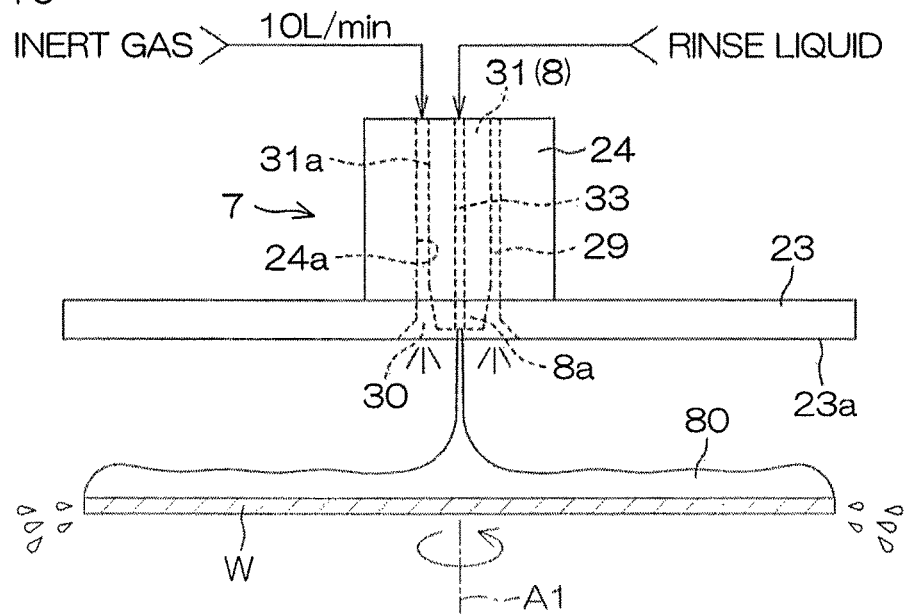
FIG. 10 is a schematic cross-sectional view for illustrating a rinsing step shown in FIG. 8.
Figure 11:
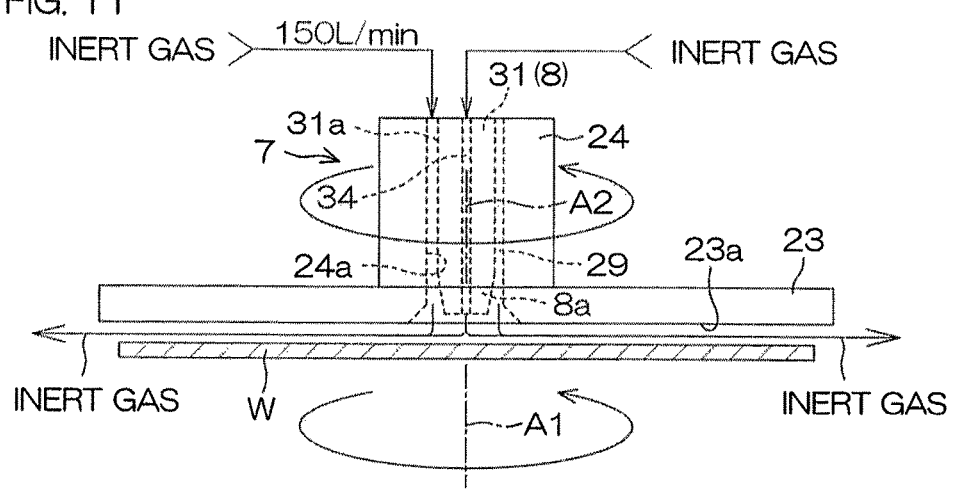
FIG. 11 is a schematic cross-sectional view for illustrating a spin drying step shown in FIG. 8.

FIG. 8 is a flow diagram for illustrating an example of substrate processing performed by the substrate processing apparatus 1. FIG. 9 is a schematic cross-sectional view for illustrating a chemical liquid step (S2). FIG. 10 is a schematic cross-sectional view for illustrating a rinsing step (S3). FIG. 11 is a schematic cross-sectional view for illustrating a spin drying step (S4).

An example of the substrate processing will be described below with reference to FIGS. 2, 7 and 8. FIGS. 9 to 11 will be referenced as necessary. The example of the substrate processing is resist removal processing for removing a resist formed on the upper surface of the substrate W.

When the resist removal processing is performed by the processing unit 2 on the substrate W, the substrate W on which ion implantation processing has been performed at a high dose is carried into the chamber 4 (step S1). Before the carrying-in of the substrate W thereto, the surrounding gas valve 42 is opened, and thus an inert gas is supplied from the surrounding gas line 41 to the cylindrical gap 29. The supply flow rate here (that is, the discharge flow rate from the surrounding gas discharge port 30) is adjusted to be a low flow rate (about 10 (liters/minute)) by the adjustment of the first flow rate adjustment valve 43. The substrate W carried thereinto is not subjected to processing for ashing the resist.

Specifically, in a state where the opposing member 7 and the nozzle 8 are retracted to the retraction position and where the chemical liquid nozzle 19 is retracted from above the spin chuck 5, the controller 3 moves the hand H (see FIG. 1) of the substrate transfer robot CR (see FIG. 1) holding the substrate W into the chamber 4, and thereby passes the substrate W to the spin chuck 5 with the front surface (resist formation surface) of the substrate W directed upward. Thereafter, the controller 3 starts the rotation of the substrate W by the spin motor 16. The speed of the substrate W is increased to a predetermined liquid processing speed (within a range of 1 to 500 rpm, for example, about 10 rpm), and is maintained at the liquid processing speed.

When the rotation speed of the substrate W reaches the liquid processing speed, the controller 3 then performs the chemical liquid step (step S2) of supplying the high-temperature SPM to the substrate W. In the chemical liquid step (step S2), the SPM discharged from the chemical liquid nozzle 19 reaches the central portion of the upper surface of the substrate W.

Specifically, the controller 3 controls the nozzle movement unit 22 to move the chemical liquid nozzle 19 from a home position to a center position. In this way, the chemical liquid nozzle 19 is arranged above the central portion of the substrate W.

After the chemical liquid nozzle 19 is arranged above the substrate W, the controller 3 opens the chemical liquid valve 21. In this way, the high-temperature (for example, about 170° C. to 180° C.) SPM is discharged from a discharge port of the chemical liquid nozzle 19 and reaches the central portion of the upper surface of the substrate W. The SPM having reached the upper surface of the substrate W receives a centrifugal force produced by the rotation of the substrate W so as to flow outward along the upper surface of the substrate W. In this way, as shown in FIG. 9, the entire upper surface of the substrate W is covered by a liquid film 70 of the SPM. The resist is removed from the front surface of the substrate W by the high-temperature SPM.

In the chemical liquid step (S2), the high-temperature SPM is supplied to the substrate W, thus a large amount of SPM mist is produced around the upper surface of the substrate W and the SPM mist floats above the substrate W. In the chemical liquid step (S2), the opposing member 7 and the nozzle 8 are in the retraction position (for example, a position in which the substrate opposite surface 23a of the shield plate 23 is separated a predetermined distance W2 (see FIG. 9) upward from the upper surface of the rotation base 18, and the distance W2 is, for example, about 150 mm), and furthermore, though a low flow rate (for example, about 10 (liters/minute)) of inert gas is discharged from the surrounding gas discharge port 30, since a large amount of SPM mist is produced in the chemical liquid step (S2), the SPM mist may enter the cylindrical gap 29 from the surrounding gas discharge port 30. In this case, the SPM mist may be adhered to the inner circumferential surface 25*a* of the shield plate 23, the inner circumferential surface 24*a* of the rotation shaft 24, and the outer circumferential surface 31*a* of the body 31. The SPM mist is estimated to enter the cylindrical gap 29 deeply. The SPM mist may also be adhered to a lower end portion (opposing portion) 8*a* of the nozzle 8. The chemical liquid mist (such as the SPM mist) adhered to the nozzle 8 is formed into particles so as to cause the contamination of the substrate.

When a predetermined chemical liquid processing period has elapsed since the start of the discharge of the SPM, the chemical liquid step (S2) is completed. Specifically, the controller 3 closes the chemical liquid valve 21 to stop the discharge of the high-temperature SPM from the chemical liquid nozzle 19, and thereafter controls the nozzle movement unit 22 to retract the chemical liquid nozzle 19 to the retraction position.

Then, the rinsing step (step S3) of supplying the rinse liquid to the upper surface of the substrate W is performed. Specifically, the controller 3 controls the lift unit 28 to arrange the opposing member 7 and the nozzle 8 in the upper intermediate position as shown in FIG. 10. The upper intermediate position is, for example, a position in which the substrate opposite surface 23*a* of the shield plate 23 is separated about 60 mm upward from the upper surface of the rotation base 18.

The controller 3 opens the rinse liquid valve 37. In this way, as shown in FIG. 10, the rinse liquid is discharged from the processing liquid discharge port 35 of the nozzle 8 toward the central portion of the upper surface of the substrate W. The rinse liquid discharged from the processing liquid discharge port 35 reaches the central portion of the upper surface of the substrate W, and receives the centrifugal force produced by the rotation of the substrate W so as to flow on the upper surface of the substrate W toward a circumferential edge portion of the substrate W. Then, the SPM on the substrate W is pushed to flow outward by the rinse liquid and is discharged around the substrate W, and the liquid film 70 of the SPM on the substrate W is replaced with a liquid film 80 of the rinse liquid which covers the entire upper surface of the substrate W. In other words, the SPM is washed off by the rinse liquid. Then, when a predetermined time has elapsed after the opening of the rinse liquid valve 37, the controller 3 closes the rinse liquid valve 37 to stop the discharge of the rinse liquid from the processing liquid discharge port 35.

Then, the spin drying step (step S4) of drying the substrate W is performed. Specifically, the controller 3 controls the lift unit 28 to lower the opposing member 7 and arrange it in the approximation position. The approximation position is, for example, a position in which the substrate opposite surface 23*a* of the shield plate 23 is separated about 1.5 mm upward from the upper surface of the rotation base 18, and when the opposing member 7 is in the approximation position, the shield plate 23 shields the upper surface of the substrate W from a surrounding space thereof.

In the spin drying step (S4), the controller 3 controls the spin motor 16 to accelerate the substrate W to a drying rotation speed (for example, several thousand rpm) higher than the rotation speeds in the chemical liquid step (S2) and the rinsing step (S3), and to rotate the substrate W at the drying rotation speed. In this way, a large centrifugal force is applied to the liquid on the substrate W, and thus the liquid adhered to the substrate W is spun off around the substrate W. As described above, the liquid is removed from the substrate W, and the substrate W is thus dried.

In the spin drying step (S4), the controller 3 controls the shield plate rotation unit 27 to rotate the shield plate 23 and the rotation shaft 24 in the same direction and substantially at the same high speed as the substrate W.

In the spin drying step (S4), the controller 3 adjusts the first flow rate adjustment valve 43 to increase the flow rate of the inert gas to be supplied from the surrounding gas line 41 to the cylindrical gap 29 to a high flow rate (for example, about 150 (liters/minute)). In this way, in the gap between the upper surface of the substrate W and the substrate opposite surface 23*a* of the shield plate 23, a stable air current of the inert gas which is directed from the central portion to the circumferential edge portion of the substrate W is produced, and thus an atmosphere in the vicinity of the upper surface of the substrate W is shielded from the surrounding thereof.

Then, when a predetermined time has elapsed since the start of the high-speed rotation of the substrate W, the controller 3 controls the spin motor 16 to stop the rotation of the substrate W performed by the spin chuck 5, and also controls the shield plate rotation unit 27 to stop the rotation of the shield plate 23 and the rotation shaft 24. The controller 3 also adjusts the first flow rate adjustment valve 43 to reduce the flow rate of the inert gas to be supplied from the surrounding gas line 41 to the cylindrical gap 29 to a low flow rate (for example, about 10 (liters/minute)).

Then, the substrate W is carried out of the chamber 4 (step S5). Before the substrate W is carried out, the controller 3 controls the lift unit 28 to raise the opposing member 7 and the nozzle 8 to the retraction position.

Then, the controller 3 moves the hand H of the substrate transfer robot CR into the chamber 4. Then, the controller 3 makes the hand H of the substrate transfer robot CR hold the substrate W on the spin chuck 5. Thereafter, the controller 3 retracts the hand H of the substrate transfer robot CR from the interior of the chamber 4. In this way, the processed substrate W is carried out of the chamber 4.

In the example of the substrate processing described previously, in the chemical liquid step (S2), $H_2O_2$ may be supplied to the upper surface of the substrate W after the supply of the high-temperature SPM to the substrate W. In this case, the SPM on the substrate W is replaced with $H_2O_2$, and after a while, the entire upper surface of the substrate W is covered by a liquid film of $H_2O_2$.

In the example of the substrate processing described previously, after the completion of the rinsing step (S3), a second chemical liquid step of supplying a chemical liquid to the upper surface of the substrate W may be performed. In this case, the chemical liquid to be used in the second chemical liquid step is preferably different from the chemical liquid used in the chemical liquid step (S2). When a high-temperature SPM is used as the chemical liquid in the chemical liquid step (S2), in the second chemical liquid step, hydrofluoric acid and SC1 (a mixed solution containing $NH_4OH$ and $H_2O_2$) can be used as the chemical liquid. When the second chemical liquid step is performed, a second rinsing step of washing off the chemical liquid on the upper surface of the substrate W with a rinse liquid is thereafter performed.

Incidentally, in the chemical liquid step (S2), a large amount of chemical liquid mist (such as the SPM mist) produced around the upper surface of the substrate W may be adhered not only to the lower end portion 8a of the nozzle 8 but also to the outer circumferential surface 31a of the body 31, the inner circumferential surface 24a of the rotation shaft 24, and the inner circumferential surface 25a of the shield plate 23. The chemical liquid mist (such as the SPM mist) adhered to the nozzle 8 is formed into particles so as to cause the contamination of the substrate. Then, in the spin drying step (S4), a high flow rate of the inert gas is passed through the cylindrical gap 29, and thus the particles adhered to the inner circumferential surface 24a and the outer circumferential surface 31a of the body 31 may be discharged from the surrounding gas discharge port 30. If the particles are discharged to the upper surface of the substrate W in the spin drying step (S4), the substrate W on which the chemical liquid processing has been performed is contaminated.

It can be considered to perform a method (an opposing portion washing step, which will be described below) of spraying the washing liquid to the nozzle 8 from below so as to wash the chemical liquid mist adhered to the outer front surface (the outer circumferential surface 31a and/or the opposite surface 31b) of the body 31 of the nozzle 8. However, with this method, it is possible to wash only a portion of the cylindrical gap 29 which is close to the surrounding gas discharge port 30. As described above, the chemical liquid mist (the SPM mist) enters the cylindrical gap 29 deeply, and hence, it is necessary to satisfactorily wash the entire region of the cylindrical gap 29.

Hence, in the example of the substrate processing, the nozzle washing step (step S6, which is illustrated by broken lines in FIG. 8) is prepared. The nozzle washing step (S6) is not performed each time the example of the substrate processing is performed but is performed every predetermined time or each time a predetermined number of substrates are processed. In other words, after the substrate W is carried out, when it is not the timing for the nozzle washing, the substrate processing on the subsequent substrate W is newly started. On the other hand, after the substrate W is carried out, when it is not the timing for the nozzle washing, the nozzle washing step (S6) is performed.

In the nozzle washing step (S6), the cylindrical gap 29 is washed with the washing liquid, and the lower end portion 8a (that is, a region which includes the processing liquid discharge port 35 and the central gas discharge port 36) of the nozzle 8 is also washed with the washing liquid (opposing portion washing step).

Figure 12:
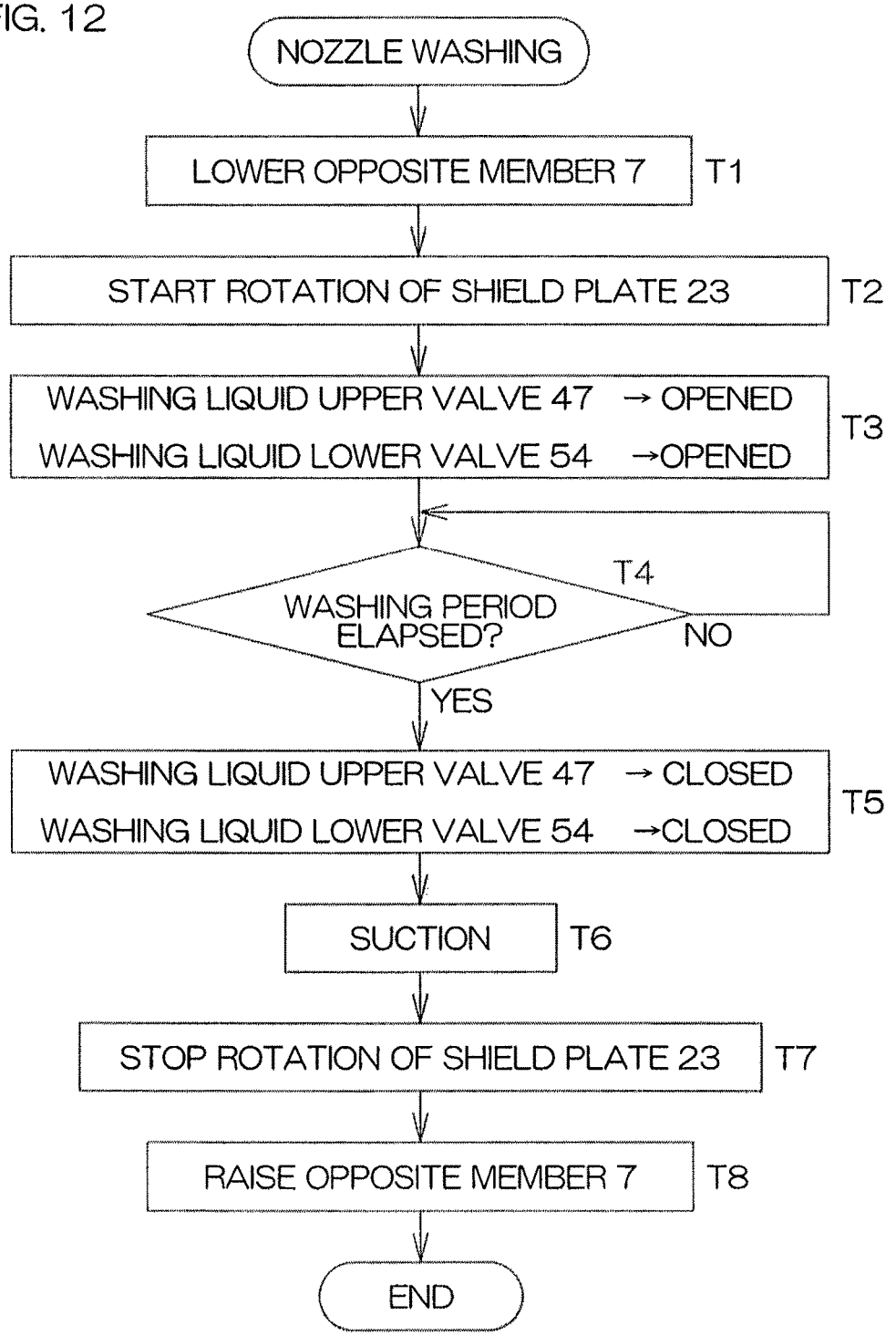
FIG. 12 is a flow diagram for illustrating a nozzle washing step shown in FIG. 8.
Figure 13:
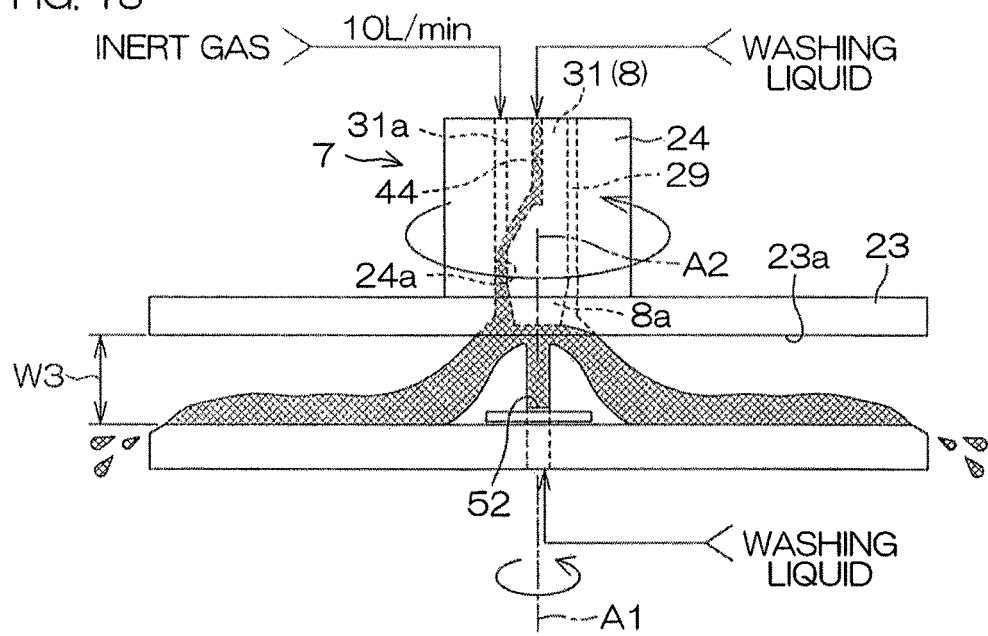
FIG. 13 is a schematic cross-sectional view for illustrating the nozzle washing step.

FIG. 12 is a flow diagram for illustrating the nozzle washing step (S6) shown in FIG. 8. FIG. 13 is a schematic cross-sectional view for illustrating the nozzle washing step (S6).

Since before the start of the nozzle washing step (S6), the surrounding gas valve 42 is in an open state. Here, the supply flow rate of the inert gas from the surrounding gas line 41 to the cylindrical gap 29 is adjusted to be a low flow rate (about 10 (liters/minute)).

In the nozzle washing step (S6), the controller 3 controls the lift unit 28 to lower the opposing member 7 and the nozzle 8 and arrange them in the lower intermediate position (step T1). In the lower intermediate position, for example, the opposite surface 31b of the body 31 of the nozzle 8 is separated a distance W3 (see FIG. 13) upward from the upper surface of the rotation base 18. The distance W3 is, for example, about 10 mm.

After the opposing member 7 and the nozzle 8 are arranged in the lower intermediate position, the controller 3 controls the shield plate rotation unit 27 to rotate the shield plate 23 at a nozzle washing speed (for example, about 800 rpm) (T2: a rotation step). In this way, the shield plate 23 and the rotation shaft 24 are rotated relative to the nozzle 8. When the rotation of the shield plate 23 and the rotation shaft 24 are started, the controller 3 controls, in a state where the nozzle 8 is kept at rest, the spin motor 16 to rotate the rotation base 18 at a predetermined low rotation speed (for example, about 100 rpm).

When the rotation speed of the shield plate 23 reaches the nozzle washing speed, the controller 3 opens the washing liquid upper valve 47 (see FIG. 2) and the washing liquid lower valve 54 (see FIG. 2) (step T3).

The washing liquid upper valve 47 is opened, and thus the washing liquid is discharged obliquely downward from the washing liquid discharge port 32 (washing liquid discharging step). The flow rate of the washing liquid discharged from the washing liquid discharge port 32 is, for example, about 800 (milliliters/minute). In this way, as shown in FIGS. 5 and 6, while the opposing member 7 is being rotated with respect to the body 31 of the nozzle 8, the washing liquid is discharged from the washing liquid discharge port 32 formed in the outer circumferential surface 31a of the body 31 toward the inner circumferential surface 24a of the rotation shaft 24. Consequently, in the cylindrical gap 29, the swirling flow R which is directed downward is formed.

At the same time when the washing liquid is discharged from the washing liquid discharge port 32, the inert gas is supplied from a position higher than a supply position where the washing liquid is supplied from the washing liquid discharge port 32 in the cylindrical gap 29 (gas supplying step). In this way, it is possible to reduce a rise of the washing liquid supplied to the cylindrical gap 29, and thus it is possible to more satisfactorily form the swirling flow R which is directed downward.

The washing liquid lower valve 54 is opened, and thus the washing liquid is discharged vertically upward from the lower surface nozzle 52, with the result that the washing liquid is sprayed to the lower end portion (opposing portion) 8a of the nozzle 8 to wash the lower end portion 8a (opposing portion washing step). Here, the flow rate of the washing liquid discharged from the lower surface nozzle 52 is such a flow rate that the washing liquid sprayed up from the lower surface nozzle 52 reaches the lower end portion 8a of the nozzle 8 arranged in the lower intermediate position (the position shown in FIG. 12), and the flow rate is, for example, about 1500 (milliliters/minute).

The discharge of the washing liquid from the washing liquid discharge port 32 and the lower surface nozzle 52 is continued until a predetermined washing period (for example, 30 seconds) has elapsed (step T4).

When the washing period has elapsed since the start of the discharge of the washing liquid (YES in step T4), the controller 3 closes the washing liquid upper valve 47 and the washing liquid lower valve 54 (step T5). In this way, the discharge of the washing liquid from the washing liquid discharge port 32 and the discharge of the washing liquid from the lower surface nozzle 52 are stopped.

After the washing liquid upper valve 47 is closed, the controller 3 opens the suction valve 51. In this way, the washing liquid within the part at the downstream side with respect to the branch position 48a in the washing liquid supply line 48 is sucked (step T6). The SPM is sucked until a tip end surface (lower end surface) of the SPM is moved back to a predetermined position, and thereafter the controller 3 closes the suction valve 51.

After the washing liquid upper valve 47 and the washing liquid lower valve 54 are closed, the controller 3 controls the shield plate rotation unit 27 to stop the rotation of the shield plate 23 and the rotation shaft 24 (step T7), and controls the lift unit 28 to raise the opposing member 7 and the nozzle 8 to the retraction position (step T8). In this way, the nozzle washing step (S6) is completed.

In this way, according to the preferred embodiment, while the opposing member 7 and the body 31 of the nozzle 8 are being relatively rotated, the washing liquid is discharged from the washing liquid discharge port 32 formed in the outer circumferential surface 31a of the body 31 toward the inner circumferential surface 24a of the opposing member 7. Since the inner circumferential surface 24a is being rotated with respect to the outer circumferential surface 31a, the washing liquid discharged from the washing liquid discharge port 32 is pulled by the rotation of the inner circumferential surface 24a and is directed downward while being rotated. In other words, a swirling flow is produced in the cylindrical gap 29. Hence, a centrifugal force and a gravitational force act on the washing liquid flowing through the cylindrical gap 29, and with these physical forces, it is possible to remove the contaminants adhered to the inner circumferential surface 25a, the inner circumferential surface 24a, and/or the outer circumferential surface 31a. In this way, it is possible to satisfactorily wash the cylindrical gap 29.

The washing liquid supply unit 10 includes the washing liquid line 44 which is inserted through the interior of the body 31. The washing liquid line 44 further includes the up/down direction line 45 and the connection line 46 which is extended obliquely downward from the lower end of the up/down direction line 45. In this way, it is possible to easily realize the configuration in which while the washing liquid line 44 is inserted through the interior of the body 31, the washing liquid is discharged from the washing liquid discharge port 32 formed in the outer circumferential surface 31a toward the inner circumferential surface 24a.

Since the opposing member 7 can be rotated, it is necessary to arrange the washing liquid line 44 such that the washing liquid line 44 does not interfere with the opposing member 7. In the preferred embodiment, since the washing liquid line 44 is inserted through the interior of the body 31, the washing liquid can be satisfactorily supplied to the washing liquid discharge port 32 without the washing liquid line 44 interfering with the opposing member 7.

As described previously, in the communication path 57 (see FIG. 2), the gas seal 58 (see FIG. 2) such as a labyrinth is interposed such that the atmosphere in the drive component storage space 56 (see FIG. 2) is shielded from the atmosphere within the chamber 4 (see FIG. 2). Since a liquid such as the washing liquid supplied into the drive component storage space 56 may affect the drive components within the drive component storage space 56, the liquid such as the washing liquid is preferably prevented from entering the communication path 57 from the cylindrical gap 29. Since the washing liquid discharge port 32 is arranged lower than the connection position 29a of the communication path 57 in the cylindrical gap 29, it is difficult for the washing liquid to enter the communication path 57. In particular, in the preferred embodiment, the washing liquid is discharged obliquely downward from the washing liquid discharge port 32, and the inert gas is supplied from above in the cylindrical gap 29 simultaneously with the discharge of the washing liquid from the washing liquid discharge port 32, with the result that it is possible to reliably reduce a rise of the washing liquid supplied to the cylindrical gap 29. In this way, it is possible to satisfactorily form the swirling flow R which is directed downward.

In the preferred embodiment, the washing (discharge of the washing liquid from the washing liquid discharge port 32) of the cylindrical gap 29 and the washing (opposing portion washing step) of the lower end portion 8a of the nozzle 8 are performed at the same time. In this way, the washing of the nozzle 8 can be performed in a short time as compared with a case where the washing of the cylindrical gap 29 and the washing of the lower end portion 8a of the nozzle 8 are respectively performed at different timings.

Figure 14:
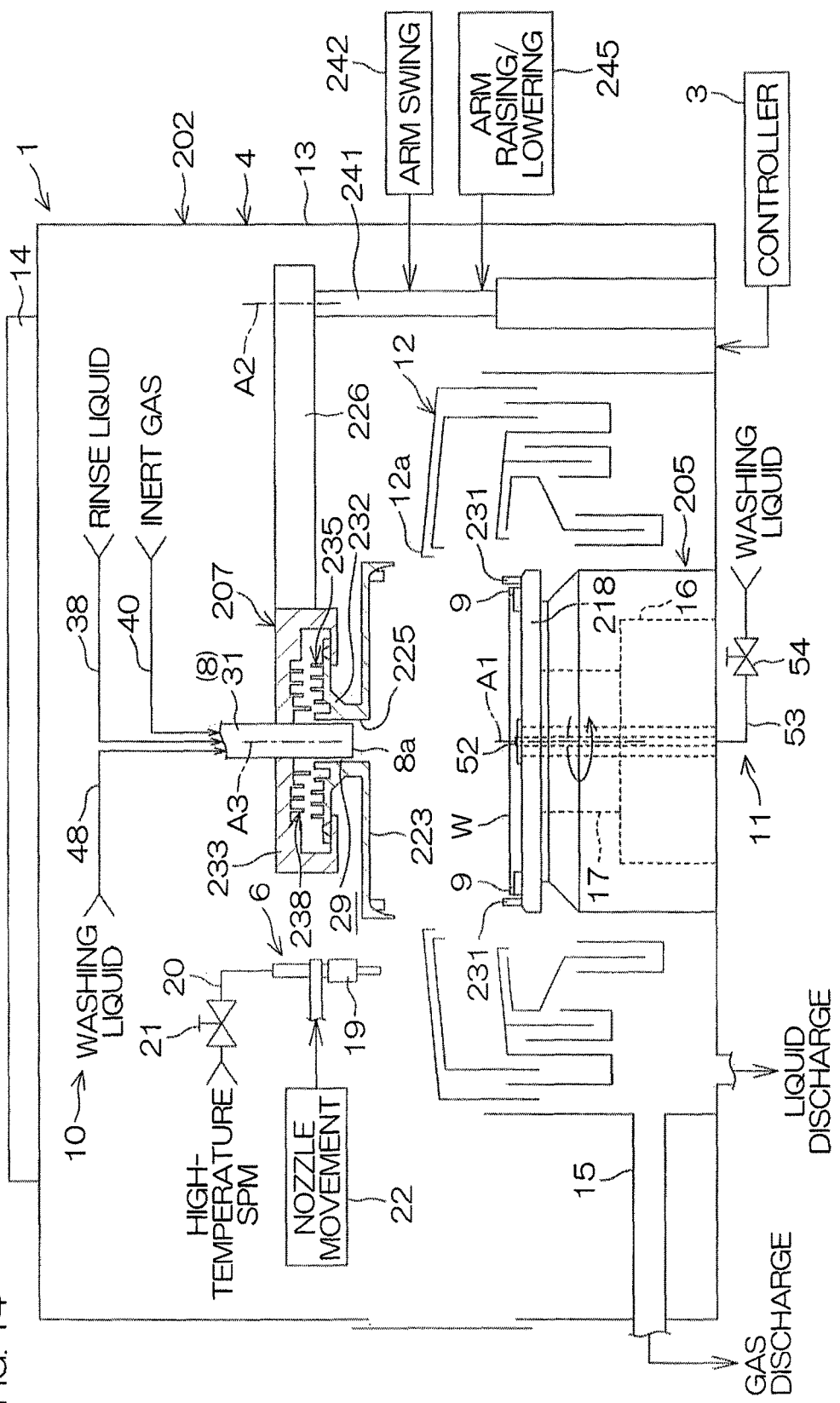
FIG. 14 is a schematic cross-sectional view for illustrating an example of the configuration of a processing unit according to another preferred embodiment of the present invention.

FIG. 14 is a schematic cross-sectional view for illustrating an example of the configuration of a processing unit 202 according to another preferred embodiment of the present invention.

In the preferred embodiment shown in FIG. 14, the same portions as in the preferred embodiment described above (the preferred embodiment shown in FIGS. 1 to 13) are identified with the same reference signs as in the case of FIGS. 1 to 13, and the description thereof will be omitted. The processing unit 202 mainly differs from the processing unit 2 according to the preferred embodiment described above in that, during processing liquid processing, an opposing member 207 is integrally rotatably supported by a spin chuck 205. In other words, the opposing member 207 is a follower-type opposing member (shielding member) which is rotated according to the spin chuck 205.

The processing unit 202 includes the chamber 4, the spin chuck (substrate holding unit) 205 which holds one substrate W in a horizontal posture within the chamber 4 and which rotates the substrate W around the vertical rotational axis A1 passing through the center of the substrate W, the chemical liquid supply unit 6, the opposing member 207 which opposes the upper surface of the substrate W held by the spin chuck 205, the nozzle 8 which is inserted up and down through the central portion of the opposing member 207, the washing liquid supply unit 10, the lower surface unit 11, and the cup 12.

As the spin chuck 5, as with the spin chuck 5, the sandwich-type chuck is adopted which sandwiches the substrate W in the horizontal direction to hold the substrate W horizontally. The spin chuck 205 includes the spin motor 16, the rotation shaft 17, and a disk-shaped rotation base 218 which is attached to the upper end of the rotation shaft 17 substantially horizontally. On the upper surface of the rotation base 218, a plurality of (three or more, for example, six) sandwiching members 9 are arranged on the circumference around the rotational axis A1. On the upper surface of the rotation base 218, on the circumference around the rotational axis A1, a plurality of (three or more) opposing member support portions 231 which support the opposing member 207 from below are arranged. The distance between the opposing member support portions 231 and the rotational axis A1 is set larger than the distance between the sandwiching members 9 and the rotational axis A1.

The spin chuck 205 is not limited to the sandwich type, and for example, the vacuum suction type (vacuum chuck) may be adopted which vacuum-sucks the rear surface of the substrate W to hold the substrate W in a horizontal posture and which further rotates the substrate W in that state around the vertical rotational axis so as to rotate the substrate W held by the spin chuck 205.

Figure 15:
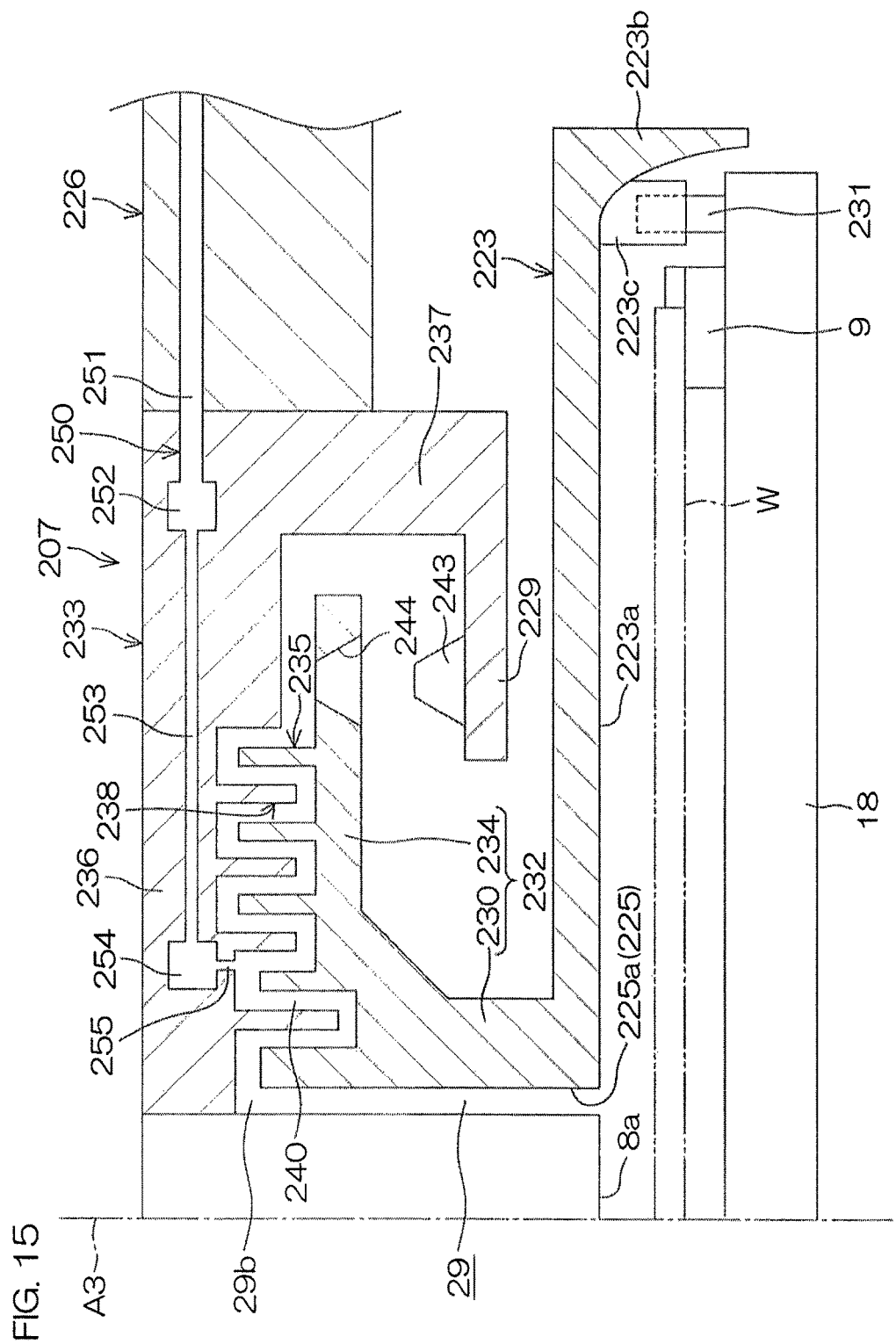
FIG. 15 is an enlarged cross-sectional view showing an opposing member included in the processing unit.

FIG. 15 is an enlarged cross-sectional view showing the opposing member 207 included in the processing unit 202. The opposing member 207 will be described with reference to FIGS. 14 and 15.

The opposing member 207 includes a shield plate 223, an engagement portion 232 which is attached to the shield plate 223 such that the engagement portion 232 can be moved integrally therewith, and a support portion 233 which is attached to a tip end portion of a support arm 226 and which is engaged with the engagement portion 232 to support the shield plate 223 from above.

The shield plate 223 is formed in the shape of a disk which has a larger diameter than that of the substrate W. The shield plate 223 includes a circular substrate opposite surface 223a in its lower surface which opposes the entire upper surface of the substrate W, an annular flange portion 223b which is protruded downward in a circumferential edge portion of the substrate opposite surface 223a, and a spin chuck contact portion 223c which is protruded from slightly inside of the circumferential edge of the substrate opposite surface 223a. In a central portion of the substrate opposite surface 223a, a through hole 225 which penetrates up and down the opposing member 207 is formed. The through hole 225 is demarcated by a circular cylindrical inner circumferential surface 225a. In a lower edge portion of the inner circumferential surface 225a, a tapered surface may be formed which is opened outward as it is extended downward.

The engagement portion 232 includes, in an upper surface of the shield plate 223, a circular cylindrical portion 230 which is fixed in a state where the circular cylindrical portion 230 surrounds the through hole 225, a flange portion 234 which is extended from the upper end of the circular cylindrical portion 230 outward in the radial direction and a first concave-convex portion 235 which is formed in the upper surface of the flange portion 234. The flange portion 234 is located higher than a flange support portion 229 of the support portion 233, which will be described below, and the outer circumference of the flange portion 234 has a larger diameter than that of the inner circumference of the flange support portion 229.

The first concave-convex portion 235 is provided by alternately arranging an annular concave portion and an annular convex portion concentrically. In other words, the first concave-convex portion 235 has a comb-tooth shape in cross section.

The support portion 233 includes a support portion main body 236 which is formed substantially in the shape of, for example, a disc, the horizontal flange support portion 229 around a central axis A3, a connection portion 237 which connects the support portion main body 236 and the flange support portion 229, and a second concave-convex portion 238 which is formed in the lower surface of the flange portion 234. The support portion main body 236 is fixed to the tip end of the support arm 226.

The second concave-convex portion 238 opposes and above the first concave-convex portion 235 of the engagement portion 232. The second concave-convex portion 238 is provided by alternately arranging an annular concave portion and an annular convex portion concentrically. In other words, the second concave-convex portion 238 has a comb-tooth shape in cross section. In a state where the support arm 226 is located in a lower position (state where the shield plate 223 is supported by the spin chuck 205), the first concave-convex portion 235 and the second concave-convex portion 238 are engaged with each other with a small gap left therebetween, and a labyrinth 240 is demarcated by the second concave-convex portion 238 and the first concave-convex portion 235.

The support arm 226 is supported by an arm support shaft 241 which is located to the side of the spin chuck 205 and which is extended substantially vertically. An arm swing unit 242 which is formed with a motor, etc., is coupled to the arm support shaft 241. An arm raising/lowering unit 245 which is formed with a servo motor, a ball screw mechanism, etc., is coupled to the arm support shaft 241.

The support arm 226 can be swung by the arm swing unit 242 within a horizontal plane around a vertical swing axis A2 set to the side of the spin chuck 205. By the swing, it is possible to turn the opposing member 207 around the swing axis A2.

As in the case of the preferred embodiment shown in FIGS. 1 to 13, the nozzle 8 is surrounded by the cylindrical gap which is formed in the shape of a circular cylinder around the nozzle 8. Since the cylindrical gap has the same configuration as the cylindrical gap 29 according to the preferred embodiment described previously, the cylindrical gap is identified with the same reference sign, and the detailed description of the cylindrical gap will be omitted. In the preferred embodiment, the nozzle 8 has a basic form of a scan nozzle in which it is possible to change the supply position of the processing fluid on the upper surface of the substrate W.

The support arm 226 can be lifted up and down by the arm raising/lowering unit 245 between a lower position (position shown in FIG. 15) and a upper position (position shown in FIG. 14), and thus the shield plate 223 of the opposing member 207 can be lifted up and down between a processing position (position shown in FIG. 15) where it approximates the upper surface of the substrate W held by the spin chuck 205 and a retraction position (position shown in FIG. 14) which is largely retracted above the spin chuck 205.

Specifically, in a state where the support arm 226 is located in the upper position, the flange support portion 229 of the support portion 233 and the flange portion 234 are engaged with each other, and thus the engagement portion 232, the shield plate 223 and the nozzle 8 are supported by the support portion 233. In other words, the shield plate 223 is suspended by the support arm 226.

In the state where the support arm 226 is located in the upper position, a protrusion 243 which is provided on an upper surface of the flange support portion 229 so as to protrude is engaged with a hole 244 which is formed a distance apart from the flange portion 234 in the circumferential direction, and thus the shield plate 223 is positioned in the circumferential direction with respect to the support portion 233.

When the arm raising/lowering unit 245 lowers the support arm 226 from the upper position, the shield plate 223 is also lowered from the retraction position. Thereafter, when the spin chuck contact portion 223c of the shield plate 223 makes contact with the opposing member support portion 231, the shield plate 223, and the nozzle 8 are received by the opposing member support portion 231. Then, when the arm raising/lowering unit 245 lowers the support arm 226, the engagement of the flange support portion 229 of the support portion 233 and the flange portion 234 is cancelled, and the engagement portion 232, the shield plate 223 and the nozzle 8 are separated from the support portion 233 and are supported by the spin chuck 205. In this state, as the spin chuck 205 (rotation base 218) is rotated, the shield plate 223 is rotated.

When the processing liquid processing is performed on the substrate W held by the spin chuck 205, the controller 3 controls the arm swing unit 242 to swing the support arm 226 around the arm support shaft 241 and arrange the opposing member 207 above the spin chuck 205. In this state, the arm raising/lowering unit 245 lowers the support arm 226. After the engagement portion 232, the shield plate 223 and the nozzle 8 are passed to the spin chuck 205, the support arm 226 is lowered and stopped in the lower position. In this way, the shield plate 223 is arranged in the processing position (position shown in FIG. 15). In this state, as the spin chuck 205 (rotation base 218) is rotated, the shield plate 223 is rotated. In other words, in a state where the substrate W is held on the spin chuck 205 and where the support arm 226 is arranged in the lower position, a rotation drive force is input to the rotation shaft 17 from the spin motor 16, and thus the rotation base 218, the substrate W, and the shield plate 223 can be rotated around the rotational axis A1.

In this state, that is, in a state where the shield plate 223 is arranged in the processing position (position shown in FIG. 15) (the state where the support arm 226 is located in the lower position), the first concave-convex portion 235 and the second concave-convex portion 238 are close to each other without making contact with each other. The first concave-convex portion 235 and the second concave-convex portion 238 each of which has a comb-tooth shape in cross section are engaged with each other with the small gap left therebetween, and thus the labyrinth 240 is demarcated between the support portion 233 and the engagement portion 232. The labyrinth 240 communicates with the cylindrical gap 29. When in the processing of the substrate W, the shield plate 223 is rotated as the spin chuck 205 is rotated, though the first concave-convex portion 235 is rotated, the second concave-convex portion 238 is not rotated.

A gas supply path 250 which supplies a gas (for example, an inert gas such as nitrogen gas) to the labyrinth 240 is connected to the labyrinth 240. The gas supply path 250 includes a first flow path 251 which is extended from the support arm 226 to reach the support portion main body 236, an annular first manifold 252 which is connected to the first flow path 251, a plurality of gas injection ports 255 which are open in a lower surface of the support portion main body 236, an annular second manifold 254 which is connected to the gas injection ports 255, and one, or a plurality of second flow paths 253 which connected to the first manifold 252 and the second manifold 254. A gas from a gas supply source is supplied to the first flow path 251 of the gas supply path 250. An example of the gas to be supplied to the first flow path 251 is an inert gas. The inert gas is, for example, either of nitrogen gas and clean gas. The gas supplied to the gas supply path 250 is discharged from the gas injection ports 255 toward the labyrinth 240. The gas discharged from the gas injection ports 255 is supplied to the labyrinth 240, and is thereafter supplied to the cylindrical gap 29. In other words, the gas is discharged from the gas injection ports 255, and thus a downward flow of the gas is formed in the cylindrical gap 29. The discharge of the gas from the gas injection ports 255 also functions as a gas seal which prevents the entry of an atmosphere from the side of the cylindrical gap 29 in the labyrinth 240.

The washing liquid discharge port 32 (see FIG. 3, etc.) is arranged lower than a connection position 29b of the labyrinth in the cylindrical gap 29.

Even in the preferred embodiment, as in the case of the preferred embodiment shown in FIGS. 1 to 13, the nozzle washing step (S6, see FIGS. 8 and 12) is performed.

In the preferred embodiment, the nozzle washing step (S6) is performed, and thus not only the actions and effects described in the preferred embodiment shown in FIGS. 1 to 13 but also actions and effects to be described below are produced.

In other words, it is not preferred that a liquid such as the washing liquid is supplied into the labyrinth 240. Since the washing liquid discharge port 32 (see FIG. 3, etc.) is arranged lower than the connection position 29b of the labyrinth in the cylindrical gap 29, it is difficult for the washing liquid discharged from the washing liquid discharge port 32 to enter the labyrinth 240. In particular, since the washing liquid is discharged obliquely downward from the washing liquid discharge port 32, and the inert gas is supplied from above in the cylindrical gap 29 simultaneously with the discharge of the washing liquid from the washing liquid discharge port 32, it is possible to reliably reduce a rise of the washing liquid supplied to the cylindrical gap 29. In this way, it is possible to reliably prevent the entry of the washing liquid into the labyrinth 240.

Although the two preferred embodiments of the present invention are described above, the present invention can also be practiced with still other preferred embodiments.

For example, when in the chemical liquid step (S2), as in the case of the preferred embodiments described above, the SPM is used as the chemical liquid, a method is adopted of supplying the SPM whose temperature is relatively low to the upper surface of the substrate W and heating the upper surface of the substrate W with an infrared heater or the like in order to satisfactorily remove the resist formed on the upper surface (front surface) of the substrate W. Even in this case, since in the chemical liquid step (S2), a large amount of SPM mist may be produced around the upper surface of the substrate W and the SPM mist may enter the cylindrical gap 29 from the surrounding gas discharge port 30, it is effective to use the nozzle washing step (S6) to wash the nozzle 8.

In the chemical liquid step (S2), as the chemical liquid, chemical liquids other than the SPM can be adopted. Specifically, as the chemical liquid, $H_2O_2$, sulfuric acid, IPA (isopropyl alcohol), hydrofluoric acid, SC1 (a mixed solution containing $NH_4OH$ and $H_2O_2$), SC2 (a mixed solution containing HCl and $H_2O_2$), ammonium fluoride, buffered hydrofluoric acid (a mixed solution of hydrofluoric acid and ammonium fluoride), FFOM (a solution containing HF and $O_3$), AOM (a solution containing $NH_4OH$ and $O_3$), HOM (a solution containing $H_2SO_4$ and $O_3$), or the like may be used.

Although in the preferred embodiments described above, the body 31 of the nozzle 8 is formed in the shape of a pillar (column), the body may be formed in the shape of a cylinder. Specifically, the processing fluid lines (the processing liquid line 33 and the gas line 34) and the washing liquid line 44 may be inserted through the interior of the cylindrical body.

Although in the preferred embodiments described above, the outline of the body 31 of the nozzle 8 is circular cylindrical, the outer circumferential surface of the body may be formed not by a cylindrical surface but by a polygonal cylindrical surface around the rotational axis A0. In this case, between the inner circumferential surfaces 25a and 24a of the opposing member 7 and the outer circumferential surface 31a of the body 31, a cylindrical gap 29 substantially in the shape of a circular cylinder is formed. Although the inner circumferential surfaces 25a and 24a of the opposing member 7 may be likewise formed by a polygonal cylindrical surface, in order to realize a smooth flow of the swirling flow R, the inner circumferential surfaces 25a and 24a are preferably a circular cylindrical surface.

Although a description is given in which the communication path 57 makes the cylindrical gap 29 and the drive component storage space 56 communicate with each other, the communication path 57 may make the cylindrical gap 29 and another space communicate with each other. Specifically, the communication path 57 may make the cylindrical gap 29 and the interior of the chamber 4 communicate with each other.

The washing liquid used for washing the nozzle 8 is not limited to water such as deionized water (DIW), and a chemical liquid for washing (for example, SC1 (a mixed solution containing $NH_4OH$ and $H_2O_2$) may be adopted.

In the nozzle washing step (S6), as the method of relatively rotating the nozzle 8 and the opposing member 7 (rotation shaft 24), the nozzle 8 may be rotated with the opposing member 7 at rest or the opposing member 7 and the nozzle 8 may be rotated in the opposite directions with respect to each other.

Although in the preferred embodiments described above, a description is given of an example using, as the nozzle 8, the center axis nozzle in which the processing liquid line 33 (processing fluid line) and the center gas line 34 (processing fluid line) are provided, the processing fluid line provided in the center axis nozzle may include one or a plurality of processing liquid lines but may not include a gas line or may include one or a plurality of gas lines but may not include a processing liquid line.

In the nozzle washing step (S6), when the rotation shaft 24 and the shield plate 23 are rotated, the rotation base 18 may be kept at rest without being rotated therewith.

In the nozzle washing step (S6), the supply of the inert gas from the surrounding gas line 41 to the cylindrical gap 29 may be stopped.

The washing (the discharge of the washing liquid from the washing liquid discharge port 32) of the cylindrical gap 29 and the washing (the spraying of the washing liquid from the lower surface unit 11) of the lower end portion 8a of the nozzle 8 may be performed at different timings.

The direction in which the washing liquid is discharged from the washing liquid discharge port 32 is not limited to the obliquely downward direction, and may be a lateral direction. In this case, as in the preferred embodiments described above, in the nozzle washing step (S6), a downward flow of the inert gas is preferably formed.

The processing fluid line does not need to be inserted through the body 31. In other words, the body 31 does not need to be the body of the nozzle 8.

The washing liquid line 44 does not need to be the configuration in which the washing liquid line 44 includes the up/down direction line 45 and the connection line 46 connecting the lower end of the up/down direction line 45 and the washing liquid discharge port 32, and the washing liquid line 44 may be curved and its downstream end may be connected to the washing liquid discharge port 32.

The washing liquid supply unit may supply the washing liquid to the washing liquid discharge port 32 in a method other than the method of inserting the washing liquid line 44 through the interior of the body 31.

Although in the preferred embodiments described above, the case where the substrate processing apparatus 1 is a device which processes the disk-shaped substrate W is described, the substrate processing apparatus 1 may be a device which processes a polygonal substrate such as a glass substrate for liquid crystal display devices.

While preferred embodiments of the present invention have been described in detail above, these are merely specific examples used to clarify the technical contents of the present invention, the present invention should not be interpreted as being limited to these specific examples, and the scope of the present invention shall be limited only by the appended claims.

The present application corresponds to Japanese Patent Application Nos. 2016-28311 and 2017-11643 respectively filed on Feb. 17, 2016 and Jan. 25, 2017 in the Japan Patent Office, and the entire disclosure of this application is incorporated herein by reference.

What is claimed is:

1. A substrate processing apparatus comprising:
    a substrate holding unit which holds a substrate in a horizontal posture;
    a body which includes an outer circumferential surface including an opposing portion opposite a central portion of an upper surface of the substrate, wherein the body is extended in an up/down direction, and the body has an outline that is cylindrical;
    an opposing member which includes an inner circumferential surface that surrounds an outer circumference of the body and forms a cylindrical gap with the outer circumferential surface of the body and which opposes the upper surface of the substrate;
    a washing liquid discharge port which is formed in the outer circumferential surface of the body and discharges a washing liquid downward in an oblique and radial direction of the body and towards the inner circumferential surface of the opposing member;
    a washing liquid supply unit which supplies the washing liquid to the washing liquid discharge port;
    a rotation unit which relatively rotates the opposing member and the body around a rotational axis passing through the central portion of the upper surface of the substrate; and
    a washing control unit which controls the washing liquid supply unit and the rotation unit so as to wash the cylindrical gap,
    wherein the washing control unit performs a rotation step of controlling the rotation unit so as to relatively rotate the opposing member and the body and a washing liquid discharging step of controlling the washing liquid supply unit so as to discharge the washing liquid from the washing liquid discharge port simultaneously with the rotation step.

2. The substrate processing apparatus according to claim 1,
    wherein the washing liquid supply unit includes a washing liquid line through which the washing liquid is passed and which is inserted through an interior of the body, and
    a downstream end of the washing liquid line is open in the outer circumferential surface of the body so as to form the washing liquid discharge port.

3. The substrate processing apparatus according to claim 1,
    wherein the washing liquid line includes an up/down direction line which is extended straight in an up/down direction and a connection line which connects a lower end of the up/down direction line and the washing liquid discharge port.

4. The substrate processing apparatus according to claim 1, further comprising:
    a gas supply unit which supplies, to the cylindrical gap, a gas from a position higher than a position in which a washing liquid is discharged from the washing liquid discharge port in the cylindrical gap,
    wherein the washing control unit controls the gas supply unit so as to further perform a gas supplying step of supplying the gas to the cylindrical gap simultaneously with the rotation step and the washing liquid discharging step.

5. The substrate processing apparatus according to claim 1, further comprising:

a processing fluid line through which a processing fluid to be supplied to the upper surface of the substrate is passed and which is inserted through an interior of the body, wherein an opening of a downstream end of the processing fluid line forms a processing fluid discharge port.

6. The substrate processing apparatus according to claim 1, further comprising:

a washing liquid spraying unit which sprays the washing liquid from below toward the opposing portion of the body, wherein the washing control unit controls the washing liquid spraying unit so as to further perform an opposing portion washing step of spraying the washing liquid to the opposing portion to wash the opposing portion simultaneously with the rotation step and the washing liquid discharging step.

* * * * *